(12) United States Patent
Yoshinaga et al.

(10) Patent No.: US 8,569,747 B2
(45) Date of Patent: Oct. 29, 2013

(54) ORGANIC ELECTROLUMINESCENCE ELEMENT AND DISPLAY DEVICE

(75) Inventors: Tadahiko Yoshinaga, Kanagawa (JP); Shigeyuki Matsunami, Kanagawa (JP); Yasunori Kijima, Tokyo (JP)

(73) Assignee: Sony Corporation, Tokyo (JP)

( * ) Notice: Subject to any disclaimer, the term of this patent is extended or adjusted under 35 U.S.C. 154(b) by 252 days.

(21) Appl. No.: 13/056,269

(22) PCT Filed: Aug. 3, 2009

(86) PCT No.: PCT/JP2009/063729
§ 371 (c)(1),
(2), (4) Date: Sep. 1, 2011

(87) PCT Pub. No.: WO2010/016454
PCT Pub. Date: Feb. 11, 2010

(65) Prior Publication Data
US 2011/0303903 A1    Dec. 15, 2011

(30) Foreign Application Priority Data

Aug. 5, 2008   (JP) ................................ 2008-201493

(51) Int. Cl.
*H01L 35/24*   (2006.01)
(52) U.S. Cl.
USPC .................................... 257/40; 257/E51.001
(58) Field of Classification Search
USPC ............................................ 257/40, E51.001
See application file for complete search history.

(56) References Cited

U.S. PATENT DOCUMENTS

| | | |
|---|---|---|
| 2007/0278937 A1 | 12/2007 | Forrest et al. |
| 2008/0164809 A1 | 7/2008 | Matsunami et al. |
| 2009/0039769 A1 | 2/2009 | Matsunami et al. |

FOREIGN PATENT DOCUMENTS

| | | |
|---|---|---|
| JP | 2000-026334 | 1/2000 |
| JP | 2003-055652 | 2/2003 |
| JP | 2004-134396 | 4/2004 |
| JP | 2008-159779 | 7/2008 |
| JP | 2008-177145 | 7/2008 |
| JP | 2008-177146 | 7/2008 |
| WO | 2007/145719 | 12/2007 |

OTHER PUBLICATIONS

International Search Report dated Nov. 2, 2009.

*Primary Examiner* — Anthony Ho
(74) *Attorney, Agent, or Firm* — Dentons US LLP

(57) ABSTRACT

A red light emitting organic electroluminescence device (11) has a structure in which an organic layer (14) including a light emitting layer (14c) is sandwiched between an anode (13) and a cathode (15). In the organic electroluminescence device (11), the light emitting layer (14c) contains, as a host material, a polycyclic aromatic hydrocarbon compound of which a parent skeleton is 4 to 7 rings, together with a red light emitting guest material. In addition, a photosensitizing layer (14d) containing a phosphorescent material having an organic material is provided adjacently to the light emitting layer (14c). Consequently, there are provided a red light organic electroluminescence device being sufficiently good in luminous efficiency and color purity and a display apparatus using the same.

12 Claims, 7 Drawing Sheets

(A)

(B)

ORGANIC ELECTROLUMINESCENCE ELEMENT AND DISPLAY DEVICE

TECHNICAL FIELD

The present invention relates to an organic electroluminescence device and a display apparatus, particularly to a red light emitting organic electroluminescence device and a display apparatus using the same.

BACKGROUND ART

In recent years, display apparatuses using organic electroluminescence devices (so-called organic EL devices) have been drawing attention as flat panel type display apparatuses which are light in weight and high in efficiency.

The organic electroluminescence devices for constituting a display apparatus as above-mentioned are provided on a transparent substrate formed, for example, of a glass or the like, and each have an anode formed of ITO (Indium Tin Oxide), an organic layer, and a cathode stacked in this order from the substrate side. The organic layer has a configuration in which a hole injection layer, a hole transport layer and an electron transporting light emitting layer are sequentially stacked in this order from the anode side. In the organic electroluminescence device thus configured, electrons injected from the cathode and holes injected from the anode are recombined in the light emitting layer, and light generated upon the recombination is taken out from the substrate side through the anode.

Organic electroluminescence devices include, other than that configured as above, a so-called top emission type one in which a cathode, an organic layer, and an anode are sequentially stacked in this order from the side of a substrate, and, further, the electrode located on the upper side (the upper electrode as cathode or anode) is formed of a transparent material, whereby light is taken out from the side of the upper electrode opposite to the substrate. Particularly, in an active matrix type display apparatus having thin film transistors (TFTs) provided on a substrate, adoption of a so-called top emission structure, in which top emission type organic electroluminescence devices are provided over the substrate formed with the TFTs, is advantageous in enhancing the aperture ratio of light emitting portions.

Meanwhile, in the case where putting an organic EL display to practical use is considered, it is necessary, other than enhancement of light emission by broadening the aperture of the organic electroluminescence device, to enhance the luminous efficiency of the organic electroluminescence device. In view of this, various materials and layer configurations have been investigated for enhancing the luminous efficiency.

For instance, in regard of a red light emitting device, a configuration in which a naphthacene derivative (inclusive of rubrene derivatives) is used as a dopant material has been proposed as a new red light emitting material substituting for the pyran derivatives represented by DCJTB which have hitherto been known (see, for example, Patent Documents 1 and 2 set forth below).

Besides, also disposed in Patent Document 2 is a configuration in which white light emission is achieved by stacking a second light emitting layer containing a penillene derivative and an anthracene derivative, on a first light emitting layer using a rubrene derivative as a dopant material.

Furthermore, a configuration is proposed in which white light emission is achieved by a method in which an electron transport layer or a hole transport layer, which is adjacent to a blue light emitting layer, is doped with a rubrene derivative (see Patent Document 3 set forth below).

PRIOR ART DOCUMENTS

Patent Documents

Patent Document 1: 2000-26334
Patent Document 2: 2003-55652 (see, particularly, paragraphs 0353 to 0357, and Table 11)
Patent Document 3: 2004-134396

SUMMARY OF THE INVENTION

Technical Problem

Meanwhile, in performing full-color display in the use of such a display device as above-mentioned, an array of respective color light emitting organic electroluminescence devices for emitting lights of three primary colors (red, green, and blue) is used, or a combination of white light emitting organic electroluminescence devices with respective color filters or color conversion layers is used. Among these configurations, the configuration in which respective color light emitting organic electroluminescence devices are used is advantageous, from the viewpoint of take-out efficiency of the emitted light.

In the light emission of the red light emitting devices using the naphthacene derivative (rubrene derivative) as above-mentioned, however, the current efficiency has been about 6.7 cd/A, and the luminescent color has been orange light emission rather than red light emission.

Accordingly, it is an object of the present invention to provide a red light emitting organic electroluminescence device sufficiently good in luminous efficiency and color purity and a display apparatus using the same.

Technical Solution

The organic electroluminescence device according to the present invention, for attaining the above object, is a red light emitting organic electroluminescence device in which an organic layer having a light emitting layer is sandwiched between an anode and a cathode. The light emitting layer contains, together with a red light emitting guest material, a host material having a polycyclic aromatic hydrocarbon compound of which a parent skeleton has 4 to 7 rings. Besides, in the organic layer, a photosensitizing layer containing a phosphorescent material having an organic material is stacked adjacently to the light emitting layer.

It has been found as will be detailed in Examples later that, in the organic electroluminescence device configured as above, current efficiency is raised as compared with a configuration lacking the photosensitizing layer, and, moreover, only the red emitted light generated in the light emitting layer is taken out from the device without any influence imposed by the photosensitizing layer containing the light emitting material.

This arises from the phenomenon in which, since the photosensitizing layer is provided adjacently to the light emitting layer, the luminous energy of phosphorescence in the photosensitizing layer is absorbed into the light emitting layer, contributing to the luminous efficiency of the light emitting layer. In this case, the phosphorescence in the phosphorescent material through triplet excitons is higher in luminous efficiency than the fluorescence through singlet excitons. Accordingly, it is possible in principle to effectively enhance the luminous efficiency of emission from the light emitting layer by using as a photosensitizing layer a phosphorescent material which is higher in luminous efficiency than the fluorescent material.

In addition, the present invention also provides a display apparatus in which a plurality of organic electroluminescence devices configured as above-mentioned are arrayed on a substrate.

In such a display apparatus as this, as above-mentioned, a display apparatus in which organic electroluminescence devices high in luminance and color purity are used as red light emitting devices is configured, so that it becomes possible, by combining the red light emitting devices with other green light emitting devices and blue light emitting devices, to perform full-color display with high color reproduction performance.

Advantageous Effect

As has been described above, according to the organic electroluminescence device of the present invention, luminous efficiency of red emitted light can be effectively enhanced while maintaining color purity.

In addition, according to the display apparatus of the present invention, it becomes possible, by putting a green light emitting device and a blue light emitting device into one set by combining them with the organic electroluminescence device constituting the red light emitting device high in color purity and luminous efficiency as above-mentioned so as to configure a pixel, to achieve full-color display with high color reproduction performance.

MODE FOR CARRYING OUT THE INVENTION

Now, an embodiment of the present invention will be described in detail below, based sequentially on an organic electroluminescence device and a display apparatus using the same.

<<Organic Electroluminescence Device>>

Figure 1:
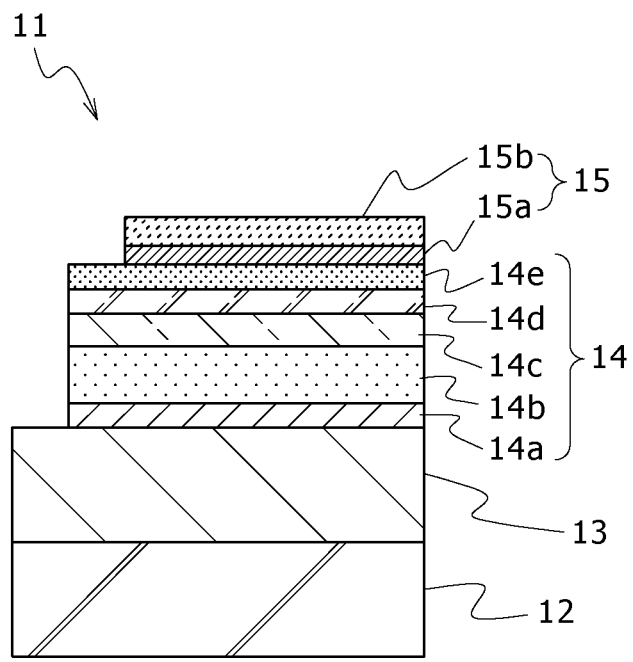
FIG. 1 is a sectional view of an organic electroluminescence device according to an embodiment.

FIG. 1 is a sectional view showing schematically an organic electroluminescence device according to the present invention. The organic electroluminescence device 11 shown in the figure has an anode 13, an organic layer 14, and a cathode 15 sequentially stacked in this order over a substrate 12. Among these components, the organic layer 14 has, for example, a hole injection layer 14a, a hole transport layer 14b, a light emitting layer 14c, a photosensitizing layer 14d, and an electron transport layer 14e layered in this order from the anode 13 side.

In the present invention, a characteristic feature resides in the configuration of the light emitting layer 14c and in the configuration in which the photosensitizing layer 14d is provided in contact with the light emitting layer 14c. In the following description, it is assumed that the organic electroluminescence device 11 with such a stacked layer configuration is configured as a top emission type device designed to emit (take out) light from the side opposite to the substrate 12, and details of the layers in this case will be described sequentially from the substrate 12 side.

<Substrate>

The substrate 12 is a support body on one principal surface side of which the organic electroluminescence devices 11 are arrayed and formed. The substrate 12 may be a known one; for example, quartz, glass, a metallic foil, or a resin-made film or sheet is used as the substrate 12. Among these, quartz and glass are preferable. In the case a resin-made substrate, examples of the material include methacrylic resins represented by polymethyl methacrylate, polyesters such as polyethylene terephthalate (PET), polyethylene naphthalate (PEN), polybutylene naphthalate (PBN), etc., and polycarbonate resins. It is necessary to provide the substrate with a stacked structure having suppressed water permeability and gas permeability or to subject the substrate to a surface treatment.

<Anode>

The anode 13 is formed by use of an electrode material being high in work function from the vacuum level of the material for injecting holes effectively. Examples of the material include metals such as aluminum (Al), chromium (Cr), molybdenum (Mo), tungsten (W), copper (Cu), silver (Ag), and gold (Au), alloys of the metals, oxides and the like of the metals and alloys, alloy of tin oxide ($SnO_2$) with antimony (Sb), ITO (indium tin oxide), InZnO (indium zinc oxide), alloy of zinc oxide (ZnO) with aluminum (Al), and, further, oxides and the like of these metals and alloys, which may be used either singly or in the state where two or more of these materials are mixed with each other.

In addition, the anode 13 may have a stacked structure of a first layer excellent in light reflectance and a second layer being provided over the first layer and having light transmitting property and a high work function.

The first layer has an alloy containing aluminum as a main constituent. An auxiliary constituent of the first layer may contain at least one element which is smaller in work function than aluminum used as the main constituent. As the auxiliary constituent, lanthanoid elements are preferable. Although the lanthanoid elements are not high in work function, containing these elements in the first layer enhances stability of the anode and satisfies hole injection performance of the anode. Other than the lanthanoid element, such elements as silicon (Si) or copper (Cu) may be contained as the auxiliary constituent.

As for the content of the auxiliary constituent in the aluminum alloy layer constituting the first layer, a total content of the auxiliary constituent is preferably not more than 10 wt % when, for example, Nd or Ni, Ti and the like for stabilizing aluminum are used as the auxiliary constituent. This ensures that the aluminum alloy layer is kept stable in the manufacturing process of the organic electroluminescence device, while maintaining reflectance of the aluminum alloy layer. Further, accuracy of processing and chemical stability can also be obtained. In addition, it is possible to improve electric conductivity of the anode 13 and adhesion of the anode 13 to the substrate 12.

Besides, as the second layer, there may be mentioned a layer having at least one selected from among oxides of aluminum alloys, oxides of molybdenum, oxides of zirconium, oxides of chromium, and oxides of tantalum. Here, for example, where the second layer is a layer of an oxide of an aluminum alloy containing a lanthanoid element as the auxiliary constituent (inclusive of a natural oxide layer), due to the high transmittance of the lanthanoid element oxide, the second layer containing the lanthanoid element oxide has good transmittance. Therefore, it is possible to maintain a high reflectance at the surface of the first layer. Further, the second layer may be a transparent conductive layer of ITO (Indium Tin Oxide), IZO (Indium Zinc Oxide) or the like. These conductive layers can improve electron injection characteristics of the anode 13.

In addition, the anode 13 may be provided, on the side for contact with the substrate 11, with a conductive layer for enhancing adhesion between the anode 13 and the substrate 12. Examples of such a conductive layer include transparent conductive layers of ITO, IZO or the like.

In the case where the driving system of the display apparatus configured by use of the organic electroluminescence device 11 is an active matrix system, the anode 13 is patterned on the basis of each pixel and is provided in the state of being connected to a drive thin film transistor provided on the substrate 12. Besides, in this case, an insulating film (not shown in the drawing) is provided over the anode 13 in such a manner that the surfaces of the anodes 13 of pixels are exposed through an aperture portion of the insulating film.

<Hole Injection Layer>

The hole injection layer 14a is for enhancing the efficiency of hole injection into the light emitting layer 14c. Examples of the material which can be suitable for forming such a hole injection layer 14a include benzyne, styrylamine, triphenylamine, porphyrin, triphenylene, azatriphenylene, tetracyanoquinodimethane, triazole, imidazole, oxadiazole, polyarylalkanes, phenylenediamine, arylamines, oxazole, anthracene, fluorenone, hydrazone, stilbene and their derivatives; polysilane compounds; and heterocyclic conjugated monomers, oligomers and polymers of vinylcarbazole compounds, thiophene compounds, aniline compounds, etc.

In addition, examples of more specific materials for the hole injection layer 14a include α-naphthylphenylphenylenediamine, porphyrin, metal-tetraphenylporphyrin, metal-naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylenevinylene), poly(thiophenevinylene), and poly(2,2'-thienylpyrrole), which are non-limitative examples.

<Hole Transport Layer>

The hole transport layer 14b is for enhancing the efficiency of hole injection into the light emitting layer 14c, like the hole injection layer 14a. Such a hole transport layer 14b is configured by use of a material selected from among the same materials as those mentioned in relation to the hole injection layer 14a above.

<Light Emitting Layer>

The light emitting layer 14c is a region in which the holes injected from the anode 13 side and the electrons injected from the cathode 15 side are recombined, upon application of a voltage to the anode 13 and the cathode 15. In the present embodiment, the configuration of the light emitting layer 14c is a characteristic feature. Specifically, the light emitting layer 14c is a layer formed by using as a host material a polycyclic aromatic hydrocarbon compound of which a parent skeleton has 4 to 7 rings. The host material is doped with a red light emitting guest material. The light emitting layer 14c generates red emitted light.

The host material for constituting the light emitting layer 14c, of the above-mentioned components, is a polycyclic aromatic hydrocarbon compound of which a parent skeleton has 4 to 7 rings, and is selected from among pyrene, benzopyrene, chrysene, naphthacene, benzonaphthacene, dibenzonaphthacene, perylene, and coronene.

In addition, the host material for constituting the light emitting layer 14c is a polycyclic aromatic hydrocarbon compound of which a parent skeleton has 4 to 7 rings, and is selected from among pyrene, benzopyrene, chrysene, naphthacene, benzonaphthacene, dibenzonaphthacene, perylene, and coronene.

Among the just-mentioned compounds, preferred for use as the host material are naphthacene derivatives represented by the following general formula (1).

[Chemical 1]

General Formula (1)

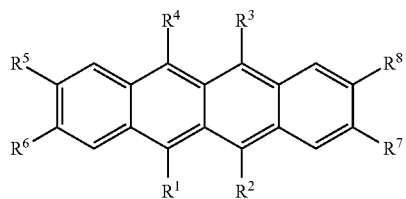

In the general formula (1), $R^1$ to $R^8$ each independently represent hydrogen, a halogen, a hydroxyl group, a substituted or unsubstituted carbonyl group of up to 20 carbon atoms, a substituted or unsubstituted carbonyl ester group of up to 20 carbon atoms, a substituted or unsubstituted alkyl group of up to 20 carbon atoms, a substituted or unsubstituted alkenyl group of up to 20 carbon atoms, a substituted or unsubstituted alkoxyl group of up to 20 carbon atoms, a cyano group, a nitro group, a substituted or unsubstituted silyl group of up to 30 carbon atoms, a substituted or unsubstituted aryl group of up to 30 carbon atoms, a substituted or unsubstituted heterocyclic group of up to 30 carbon atoms, or a substituted or unsubstituted amino group of up to 30 carbon atoms.

Examples of the aryl groups represented by $R^1$ to $R^8$ in the general formula (1) include phenyl group, 1-naphthyl group, 2-naphthyl group, fluorenyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 1-chrysenyl group, 6-chrysenyl group, 2-fluoranthenyl group, 3-fluororanthenyl group, 2-biphenylyl group, 3-biphenylyl group, 4-biphenylyl group, o-tolyl group, m-tolyl group, p-tolyl group, p-t-butylphenyl group, etc.

Besides, examples of the heterocyclic groups represented by $R^1$ to $R^8$ include 5-membered or 6-membered aromatic heterocyclic groups containing O, N, or S as a hetero atom, and condensed polycyclic aromatic heterocyclic groups of 2 to 20 carbon atoms. In addition, examples of the aromatic heterocyclic groups and the condensed polycyclic aromatic heterocyclic group include thienyl group, furyl group, pyrrolyl group, pyridyl group, quinolyl group, quinoxalyl group, imidazopyridyl group, and benzothiazole group. Representative examples of the them include 1-pyrrolyl group, 2-pyrrolyl group, 3-pyrrolyl group, pyradinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbozolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, and 9-acridinyl group.

The amino group represented by $R^1$ to $R^8$ may be any of alkylamino groups, arylamino groups, aralkylamino groups, etc. These preferably have an aliphatic carbon ring of a total of 1 to 6 carbon atoms and/or an aromatic carbon ring of 1 to 4 rings. Examples of these groups include dimethylamino group, diethylamino group, dibutylamino group, diphenylamino group, ditolylamino group, bisbiphenylylamino group, and dinaphthylamino group.

Incidentally, two or more of the above-mentioned substituent groups may form a condensed ring, and may further have a substituent group.

Besides, particularly, the naphthacene derivative represented by the above general formula (1) is preferably a rubrene derivative represented by the following general formula (1a).

[Chemical 2]

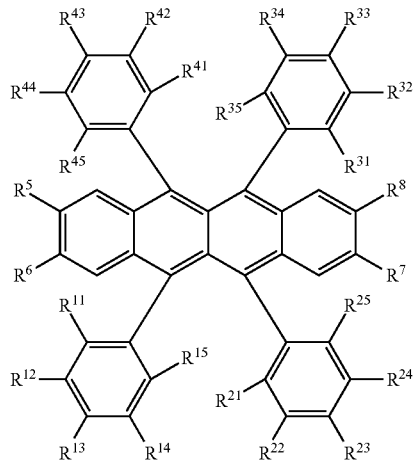

General Formula (1a)

In the general group (1a), $R^{11}$ to $R^{15}$, $R^{21}$ to $R^{25}$, $R^{31}$ to $R^{35}$, and $R^{41}$ to $R^{45}$ each independently represent a hydrogen atom, an aryl group, a heterocyclic ring group, an amino group, an aryloxy group, an alkyl group, or an alkenyl group. It is to be noted here that $R^{11}$ to $R^{15}$, $R^{21}$ to $R^{25}$, $R^{31}$ to $R^{35}$, and $R^{41}$ to $R^{45}$ are preferably the same, respectively.

In addition, $R^5$ to $R^8$ in the general formula (1a) are each independently a hydrogen atom, an aryl group which may have a substituent group, or an alkyl or alkenyl group which may have a substituent group.

Preferred modes of the aryl group, heterocyclic group, and amino group in the general formula (1a) may be the same as $R^1$ to $R^8$ in the general formula (1). Incidentally, where $R^{11}$ to $R^{15}$, $R^{21}$ to $R^{25}$, $R^{31}$ to $R^{35}$, and $R^{41}$ to $R^{45}$ are amino groups, they are alkylamino groups, arylamino groups or aralkylamino groups. These preferably have an aliphatic group of a total of 1 to 6 carbon atoms or 1 to 4 aromatic carbon rings. Examples of such a group include dimethylamino group, diethylamino group, dibutylamino group, diphenylamino group, ditolylamino group, and bisbiphenylamino group.

More specific other examples of the naphthacene derivative used preferably as the host material in the light emitting layer 14c include rubrene of the following compound (1)-1 which is one of the rubrene derivatives of the general formula (1a), and, as other than this, the following compounds (1)-2 to (1)-4 may be mentioned.

[Chemical 3]

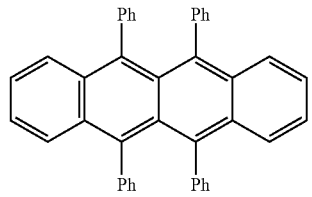

Compd (1)-1

Compd (1)-2

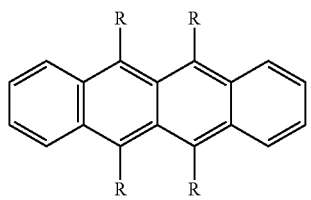

R = 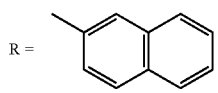

Compd (1)-3

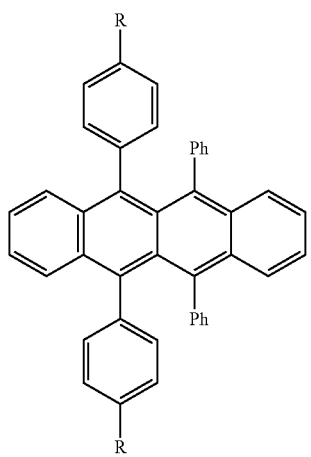

R = 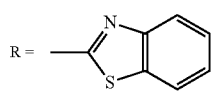

Compd (1)-4

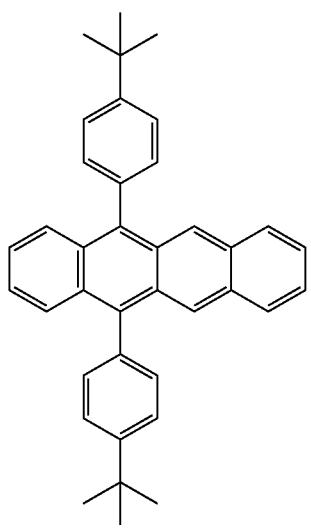

Besides, as the red light emitting guest material constituting the light emitting layer 14c, there may be used a perylene derivative of the general formula (2), a diketopyrrolopyrrole derivative of the general formula (3), a pyrromethene complex of the general formula (4), a pyran derivatives of the general formula (5), or a styryl derivative of the general formula (6), which will be described next. Now, the red light emitting guest material will be described in detail below.

Perylene Derivative

As the red light emitting guest material, there is used, for example, a compound (diindeno[1,2,3-cd]perylene derivative) represented by the following general formula (2).

[Chemical 4]

General Formula (2)

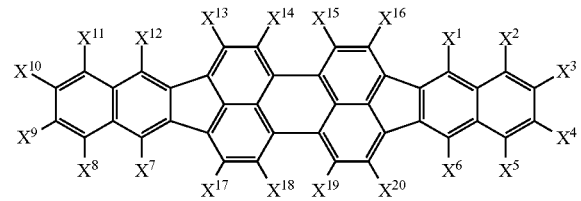

In the general formula (2), $X^1$ to $X^{20}$ each independently represent hydrogen, a halogen, hydroxyl group, a substituted or unsubstituted carbonyl group of up to 20 carbon atoms, a substituted or unsubstituted carbonyl ester group of up to 20 carbon atoms, a substituted or unsubstituted alkyl group of up to 20 carbon atoms, a substituted or unsubstituted alkenyl group of up to 20 carbon atoms, a substituted or unsubstituted alkoxyl group of up to 20 carbon atoms, cyano group, nitro group, a substituted or unsubstituted silyl group of up to 30 carbon atoms, a substituted or unsubstituted aryl group of up to 30 carbon atoms, a substituted or unsubstituted heterocyclic group of up to 30 carbon atoms, or a substituted or unsubstituted amino group of up to 30 carbon atoms.

Examples of the aryl groups represented by $X^1$ to $X^{20}$ in the general formula (2) include phenyl group, 1-naphthyl group, 2-naphthyl group, fluorenyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 1-chrysenyl group, 6-chrysenyl group, 2-fluoranthenyl group, 3-fluoranthenyl group, 2-biphenylyl group, 3-biphenylyl group, 4-biphenylyl group, o-tolyl group, m-tolyl group, p-tolyl group, and p-t-butylphenyl group.

Besides, examples of the heterocyclic groups represented by $X^1$ to $X^{20}$ include 5-membered or 6-membered aromatic heterocyclic groups containing O, N, or S as a hetero atom, and condensed polycyclic aromatic heterocyclic groups of 2 to 20 carbon atoms. In addition, examples of the aromatic heterocyclic groups and the condensed polycyclic aromatic heterocyclic group include thienyl group, furyl group, pyrrolyl group, pyridyl group, quinolyl group, quinoxalyl group, imidazopyridyl group, and benzothiazole group. Representative examples of the them include 1-pyrrolyl group, 2-pyrrolyl group, 3-pyrrolyl group, pyradinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbozolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, and 9-acridinyl group.

The amino group represented by $X^1$ to $X^{20}$ may be any of alkylamino groups, arylamino groups, aralkylamino groups, etc. These preferably have an aliphatic carbon ring of a total of 1 to 6 carbon atoms and/or an aromatic carbon ring of 1 to 4 rings. Examples of these groups include dimethylamino group, diethylamino group, dibutylamino group, diphenylamino group, ditolylamino group, bisbiphenylylamino group, and dinaphthylamino group.

Incidentally, two or more of the above-mentioned substituent groups may form a condensed ring, and may further have a substituent group.

Specific examples of the diindeno[1,2,3-cd]perylene derivative used preferably as the red light emitting guest material in the light emitting layer 14c include the following Compounds (2)-1 to (2)-8.

It is to be noted, however, that the present invention is not limited to these materials in any way.

[Chemical 5]

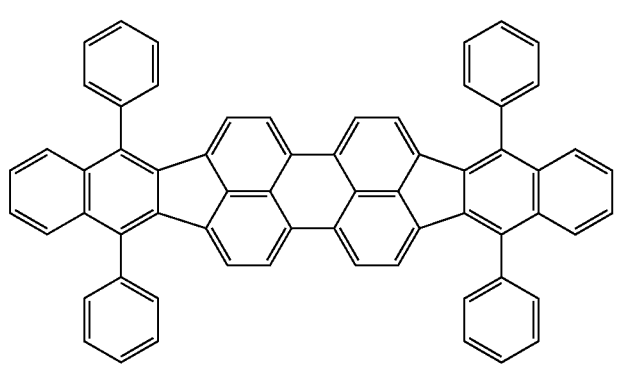

Compd (2)-1

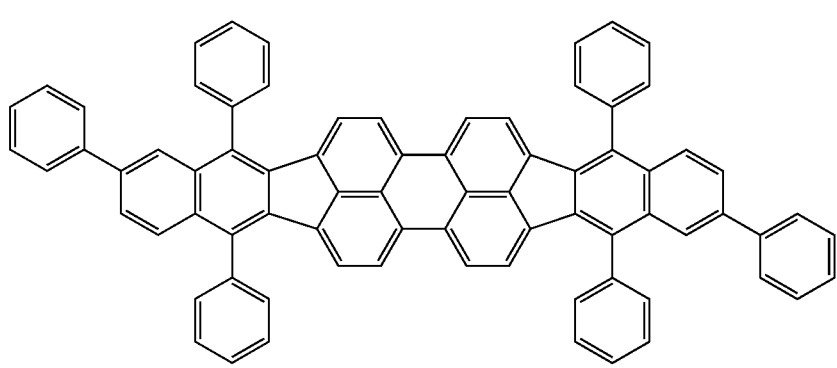

Compd (2)-2

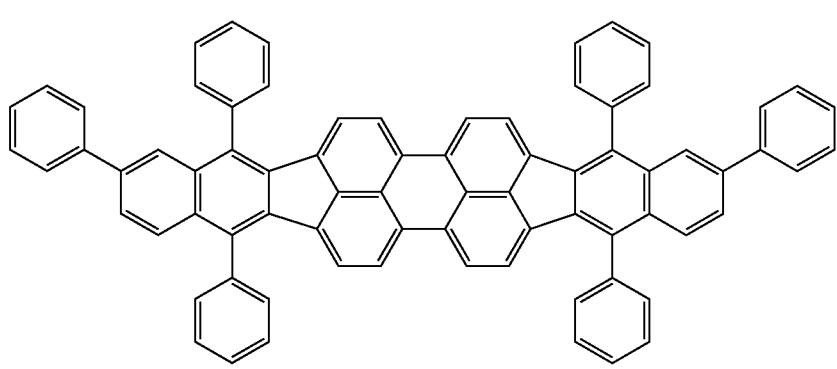

Compd (2)-3

Compd (2)-4
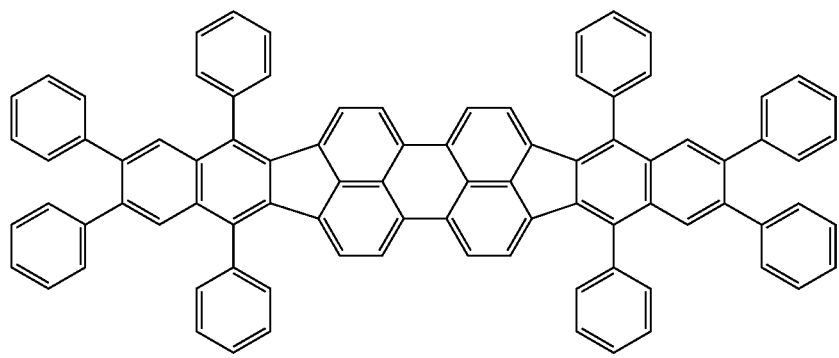
Compd (2)-5
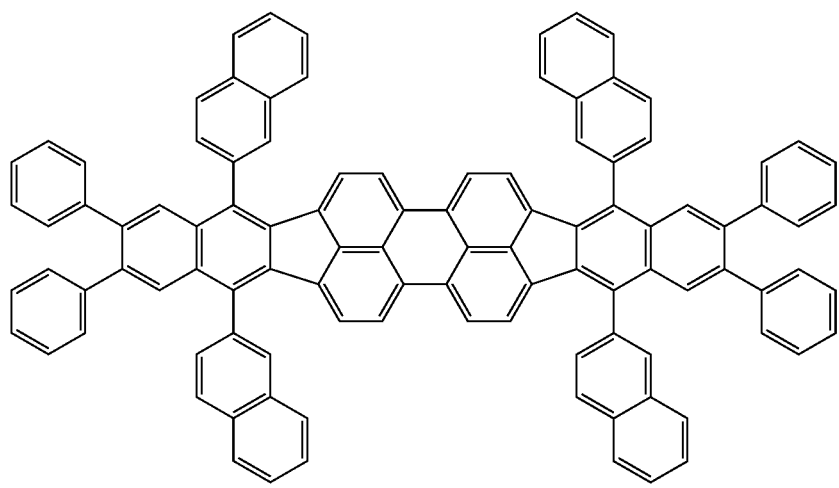
Compd (2)-6
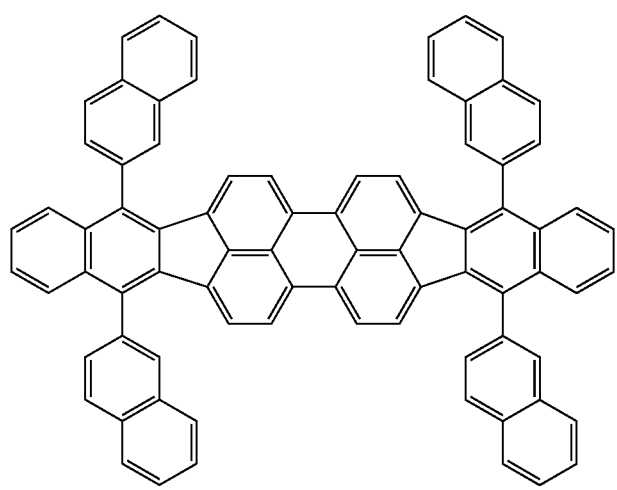

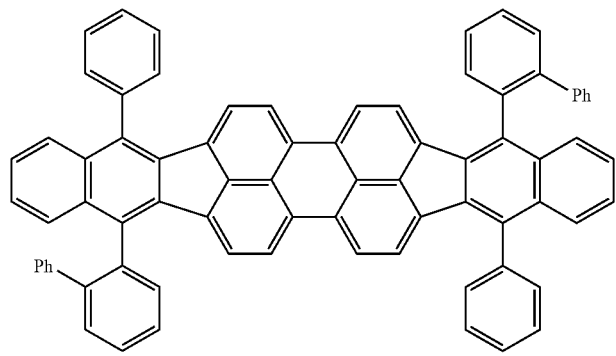

Compd (2)-7

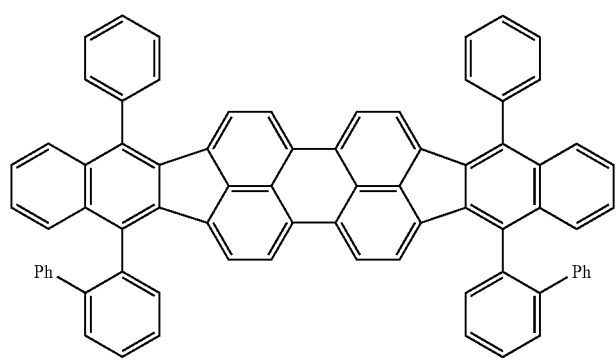

Compd (2)-8

Diketopyrrolopyrrole Derivative

As the red light emitting guest material, there is used, for example, a compound (diketopyrrolopyrrole derivative) represented by the following general formula (3).

[Chemical 6]

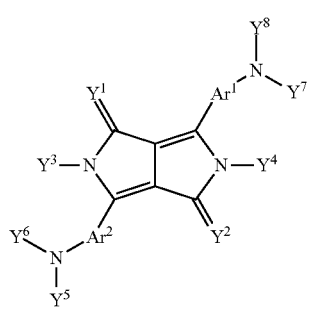

General Formula (3)

In the general formula (3), $Y^1$ and $Y^2$ each independently represent an oxygen atom, or a substituted or unsubstituted imino group. In addition, $Y^3$ to $Y^8$ each independently represent hydrogen, a halogen, a substituted or unsubstituted alkyl group of up to 20 carbon atoms, a substituted or unsubstituted alkenyl group of up to 20 carbon atoms, a substituted or unsubstituted aryl group of up to 30 carbon atoms, a substituted or unsubstituted heterocyclic group of up to 30 carbon atoms, or a substituted or unsubstituted amino group of up to 30 carbon atoms.

Besides, in the general formula (3), $Ar^1$ and $Ar^2$ each represent a bivalent group selected from among substituted or unsubstituted aromatic hydrocarbon groups and substituted or unsubstituted aromatic heterocyclic groups.

Incidentally, the substituted or unsubstituted aryl groups represented by $Y^3$ to $Y^8$, the heterocyclic groups represented by $Y^3$ to $Y^8$ and, further, the amino groups represented by $Y^3$ to $Y^8$ are the same as those indicated in the perylene derivative of the general formula (2). In addition, two or more of the above-mentioned substituent groups may form a condensed ring, and, further, may have a substituent group, in the same manner as above.

Specific examples of the diketopyrrolopyrrole derivative used preferably as the red light emitting guest material in the light emitting layer 14c include the following Compounds (3)-1 to (3)-14. It is to be noted, however, that the present invention is not limited to these materials in any way.

[Chemical 7-1]

Compd (3)-1

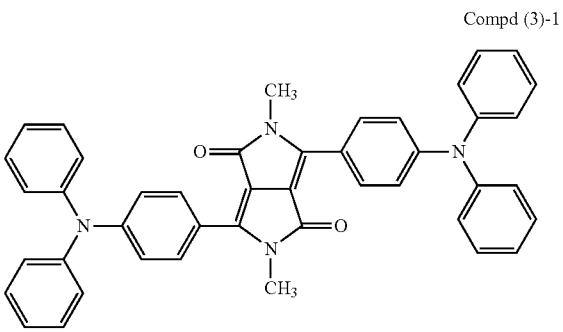

Compd (3)-2
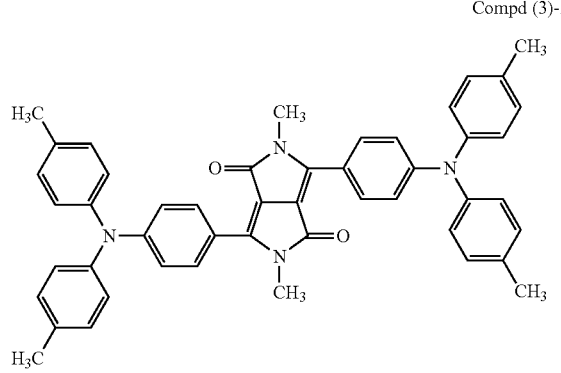
Compd (3)-3
Compd (3)-4
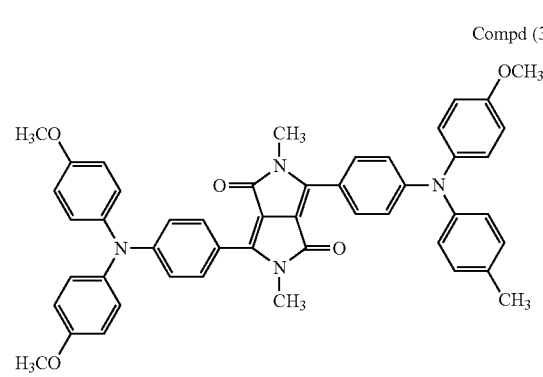
Compd (3)-5
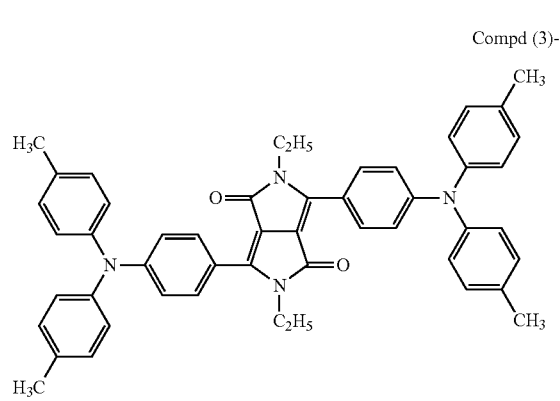
Compd (3)-6
Compd (3)-7
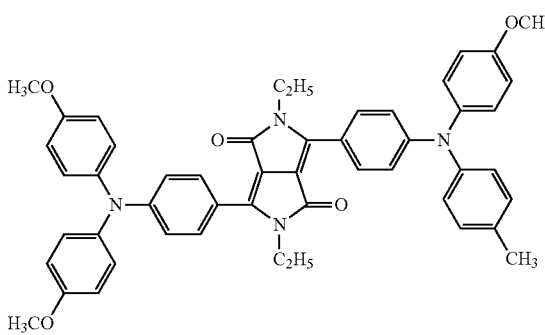
Compd (3)-8
[Chemical 7-2]
Compd (3)-9
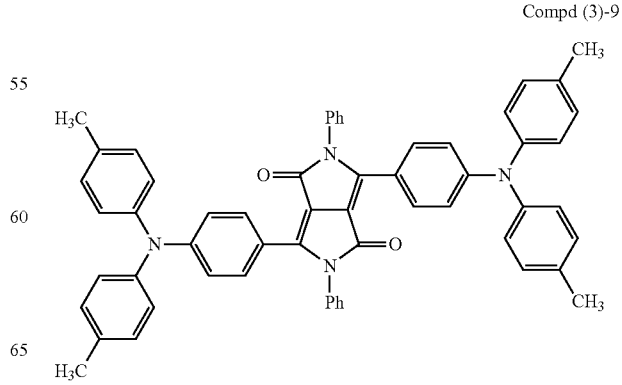

Pyrromethene Complex

As the red light emitting guest material, there is used, for example, a compound (pyrromethene complex) represented by the following general formula (4).

[Chemical 8]

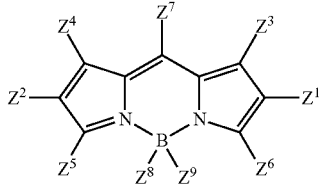

General Formula (4)

In the general formula (4), however, $Z^1$ to $Z^9$ each independently represent hydrogen, a halogen, a substituted or unsubstituted alkyl group of up, to 20 carbon atoms, a substituted or unsubstituted alkenyl group of up to 20 carbon atoms, a substituted or unsubstituted alkoxyl group of up to 20 carbon atoms, cyano group, nitro group, a substituted or unsubstituted silyl group of up to 30 carbon atoms, a substituted or unsubstituted aryl group of up to 30 carbon atoms, a substituted or unsubstituted heterocyclic group of up to 30 carbon atoms, or a substituted or unsubstituted amino group of up to 30 carbon atoms.

Incidentally, the substituted or unsubstituted aryl groups represented by $Z^1$ to $Z^9$, the heterocyclic groups represented by $Z^1$ to $Z^9$, and the amino groups represented by $Z^1$ to $Z^9$, in the general formula (7), are the same as the groups indicated in relation to the perylene derivative of the general formula (2). In addition, two or more of the above-mentioned substituent groups may form a condensed ring, and, further, have a substituent group, in the same manner as above.

Specific examples of the pyrromethene complex used preferably as the red light emitting guest material in the light emitting layer 14c include the following Compounds (4)-1 to (4)-68. It is to be noted, however, that the present invention is not limited to these materials in any way.

[Chemical 9-1]

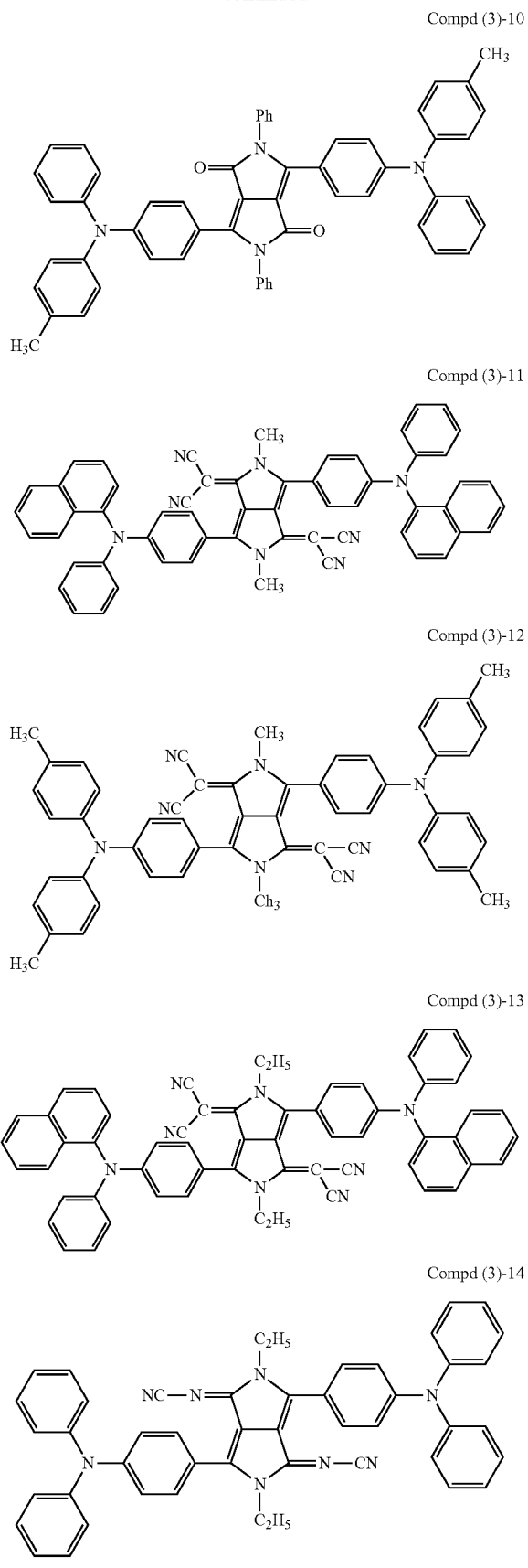

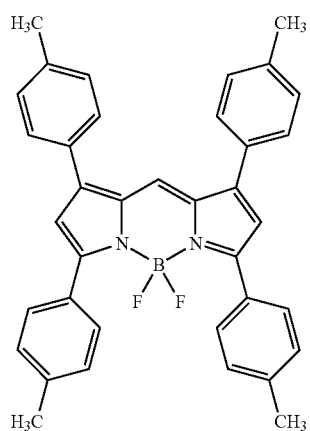

Compd (4)-1

Compd (4)-2
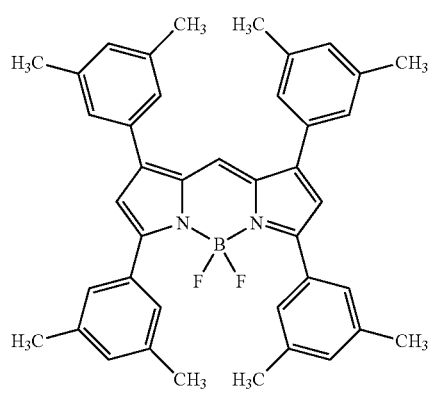
Compd (4)-5
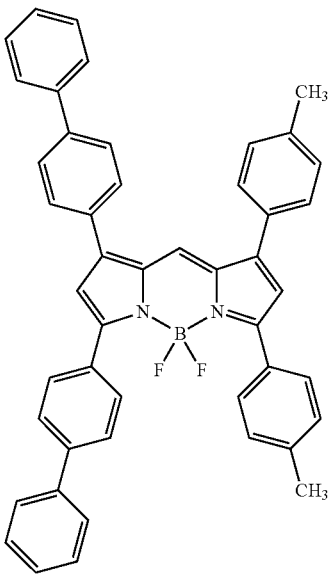
Compd (4)-3
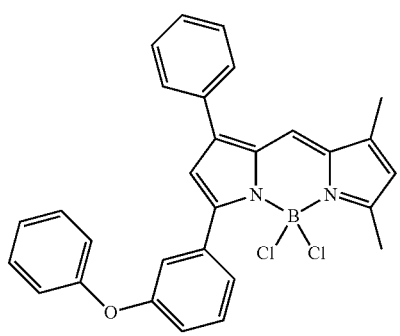
Compd (4)-6
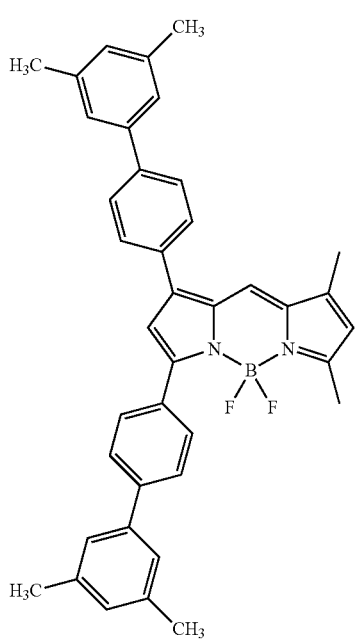
Compd (4)-4
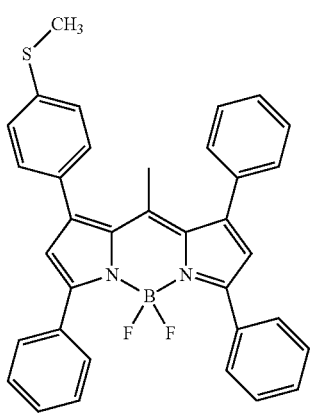
[Chemical 9-2]
Compd (4)-7
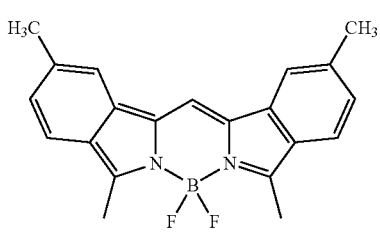

-continued
Compd (4)-8
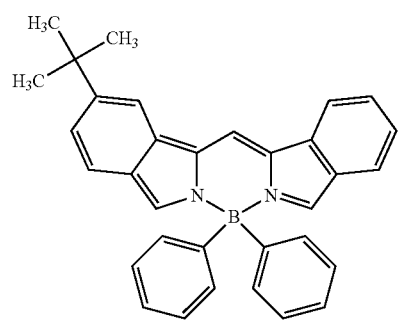
Compd (4)-9
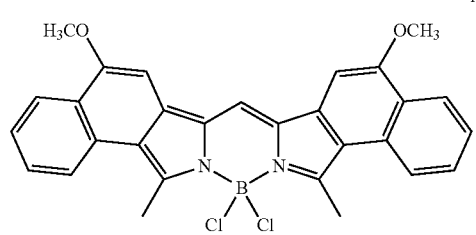
Compd (4)-10
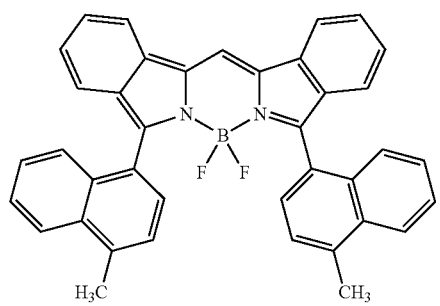
Compd (4)-11
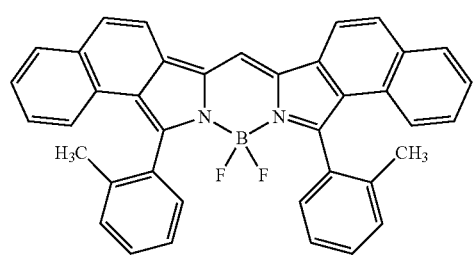
Compd (4)-12
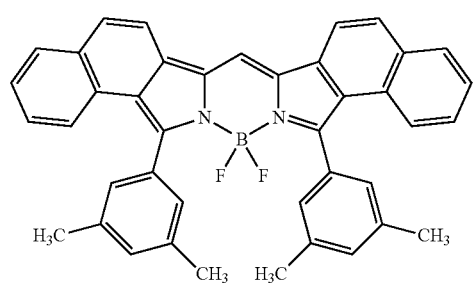
-continued
Compd (4)-13
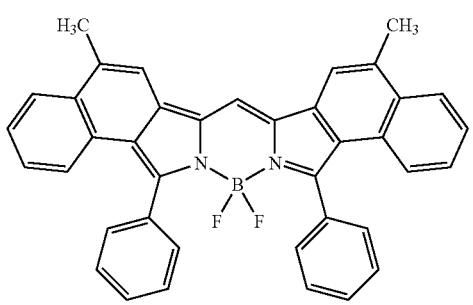
Compd (4)-14
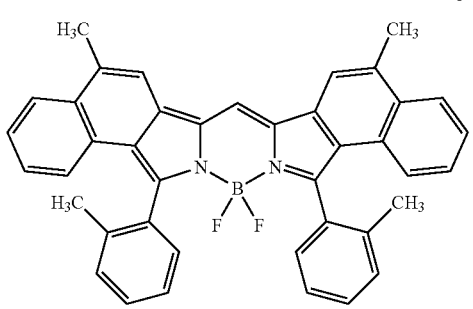
[Chemical 9-3]
Compd (4)-15
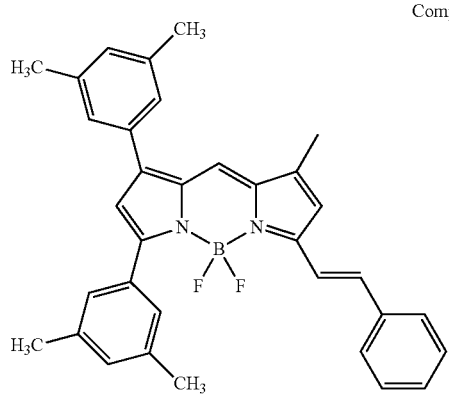
Compd (4)-16
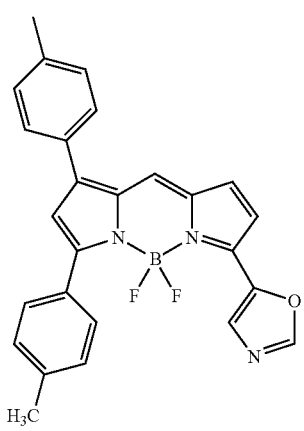

-continued
Compd (4)-17
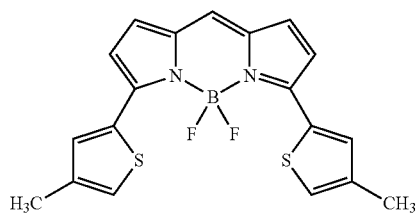
Compd (4)-18
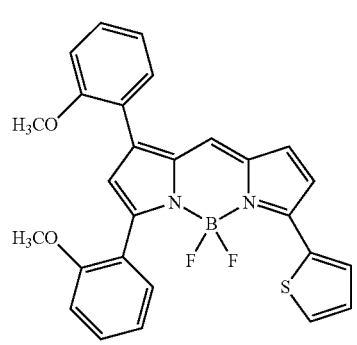
Compd (4)-19
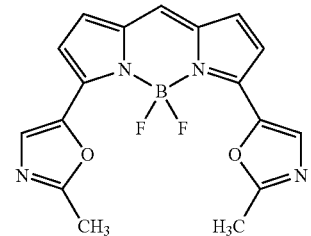
Compd (4)-20
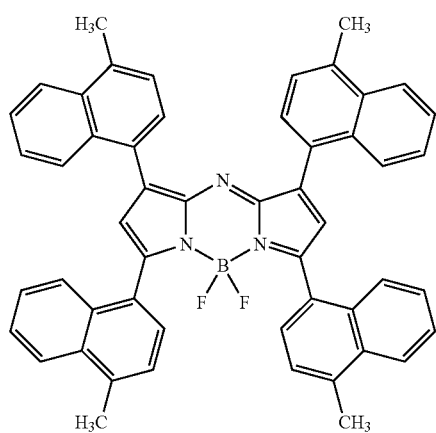
-continued
[Chemical 9-4]
Compd (4)-21
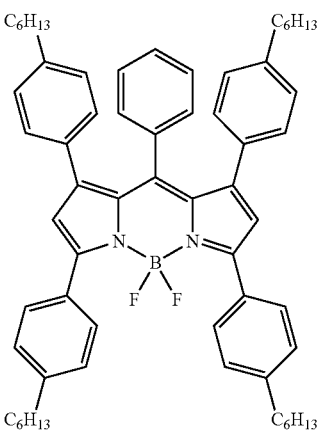
Compd (4)-22
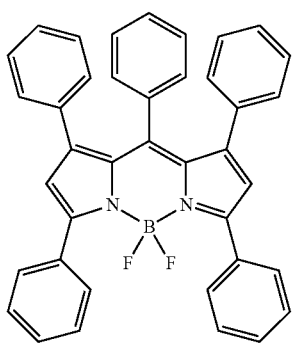
Compd (4)-23
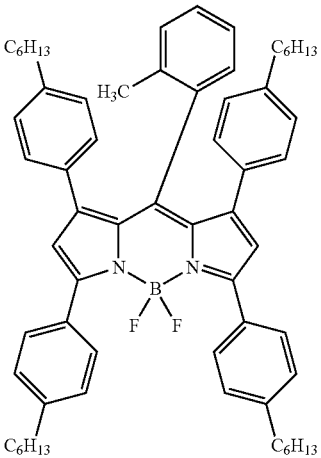

Compd (4)-24
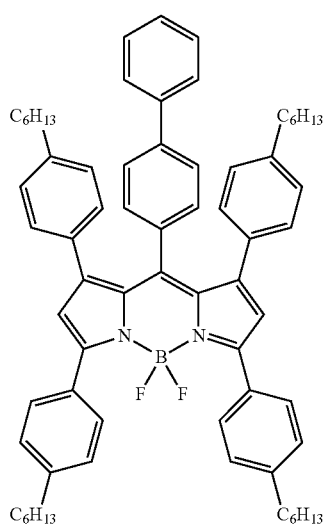
Compd (4)-27
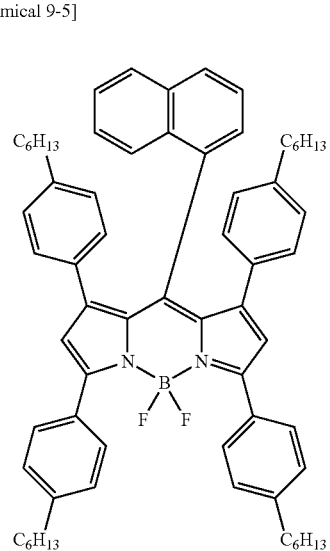
Compd (4)-25
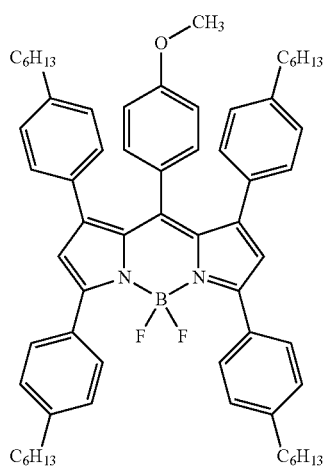
Compd (4)-28
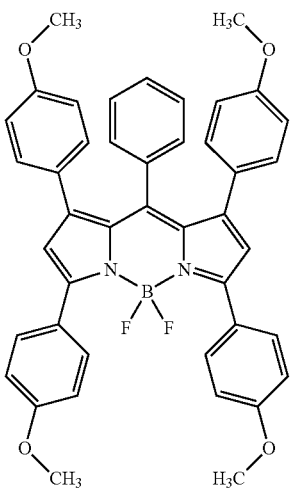
Compd (4)-26
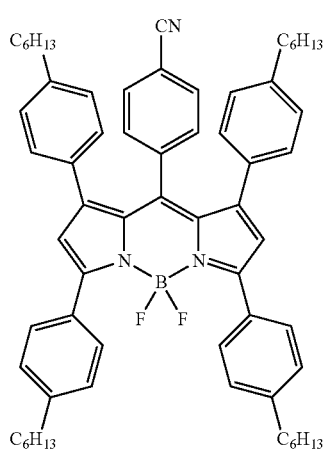
Compd (4)-29
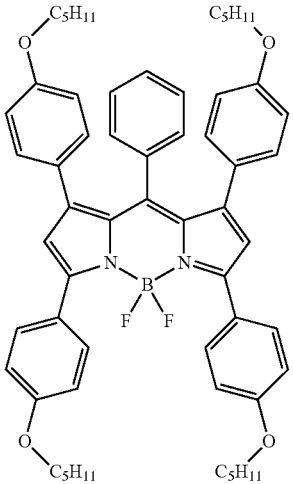

Compd (4)-30
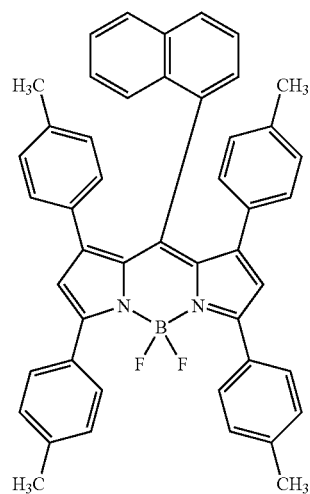
Compd (4)-32
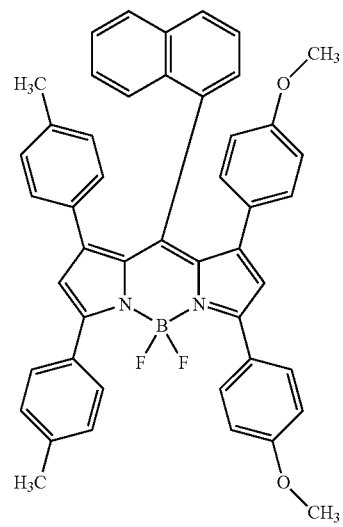
[Chemical 9-6]
Compd (4)-33
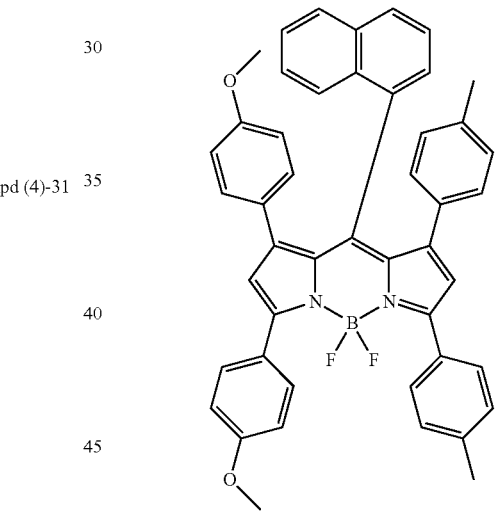
Compd (4)-31
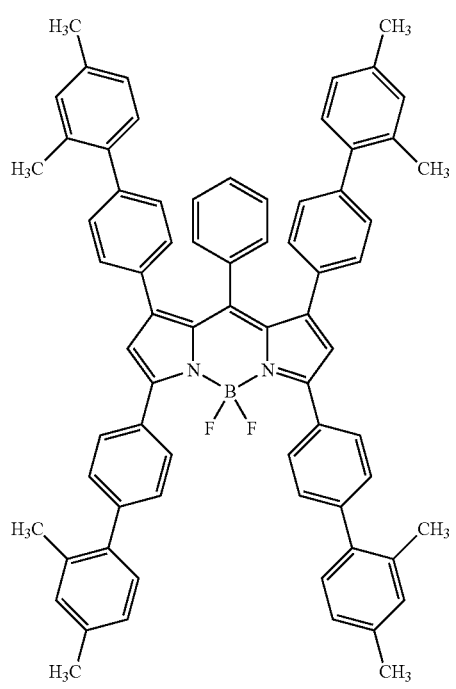
Compd (4)-34
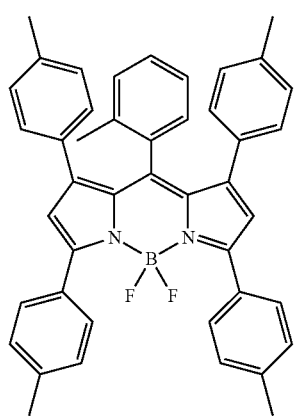

Compd (4)-35
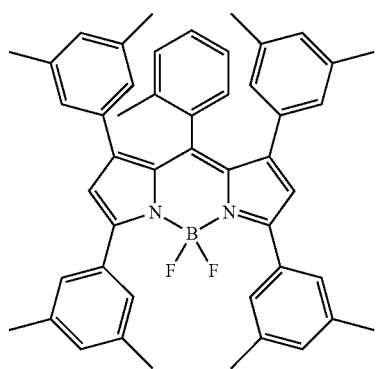
Compd (4)-36
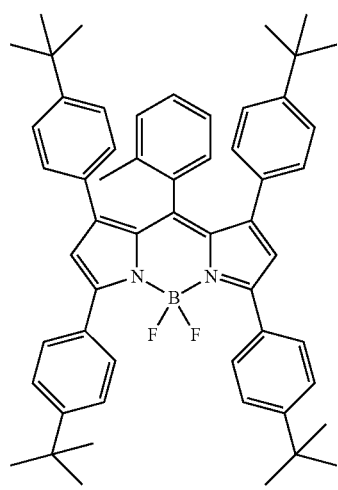
Compd (4)-37
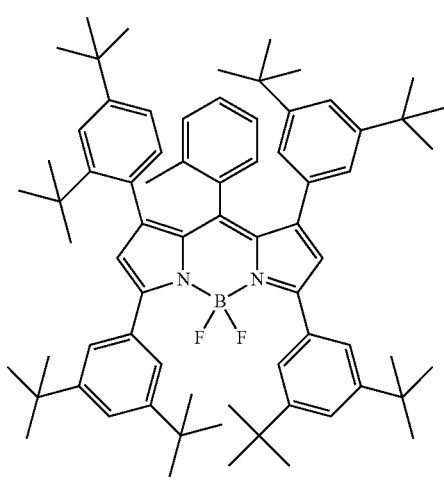
Compd (4)-38
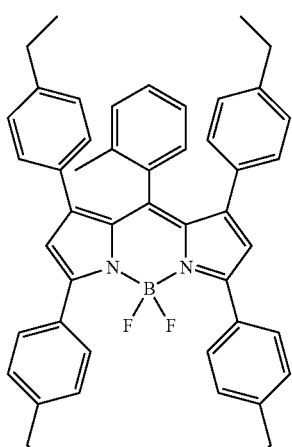
Compd (4)-39
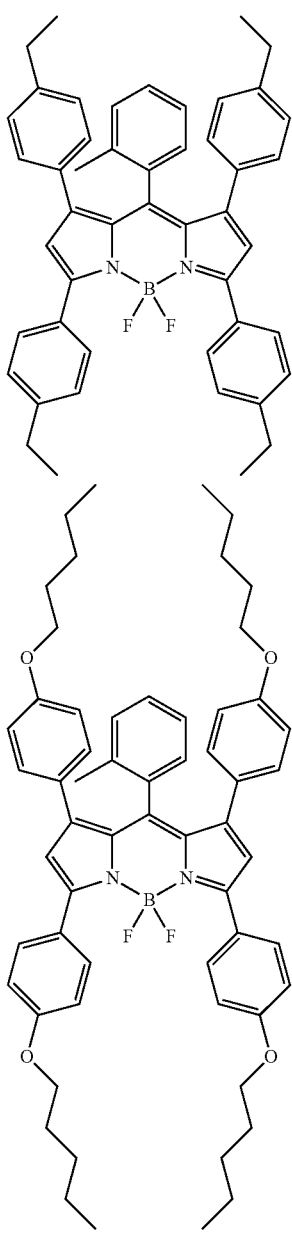
[Chemical 9-7]
Compd (4)-40
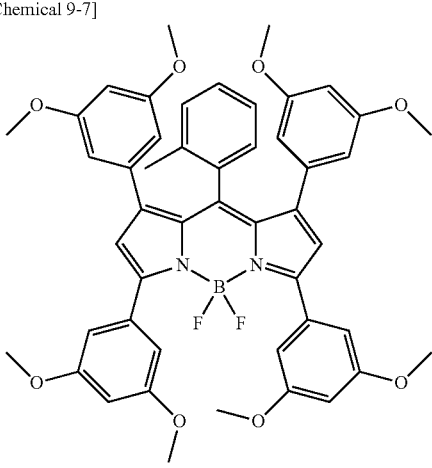

Compd (4)-41
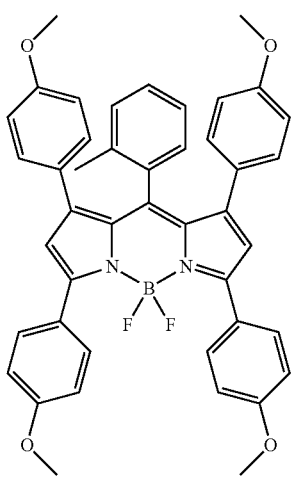
Compd (4)-44
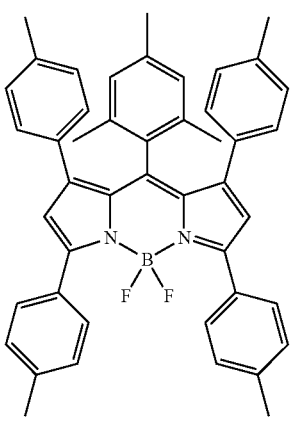
Compd (4)-42
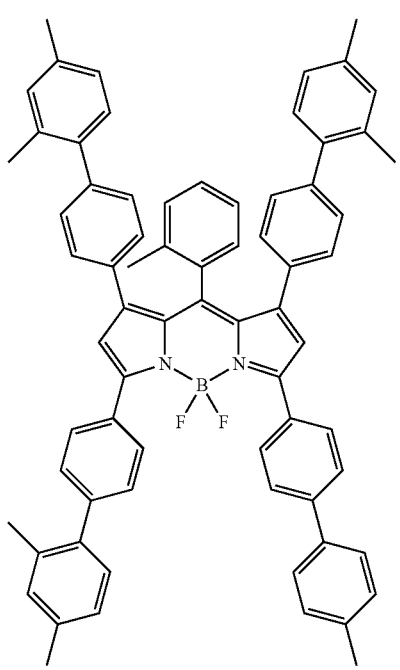
Compd (4)-45
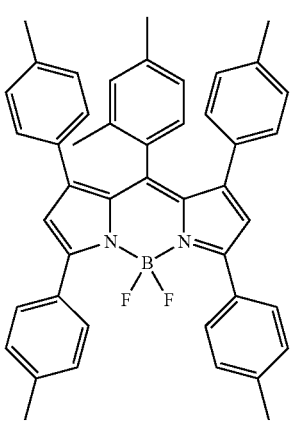
Compd (4)-43
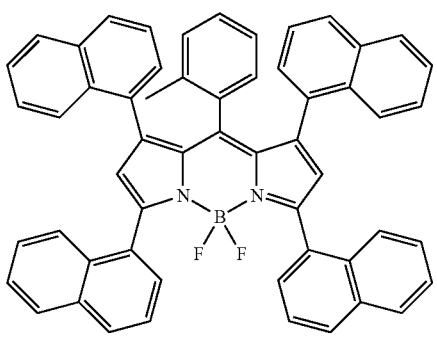
Compd (4)-46
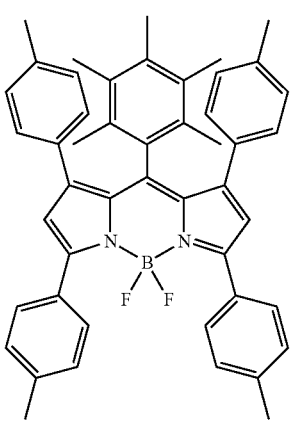

[Chemical 9-8]
Compd (4)-47
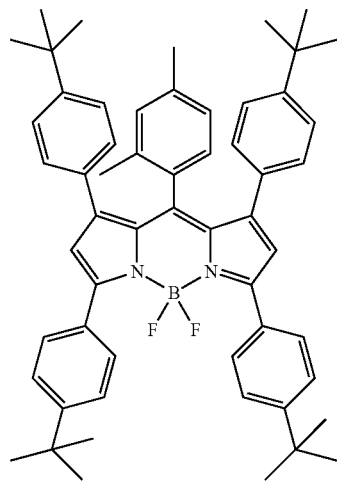
Compd (4)-48
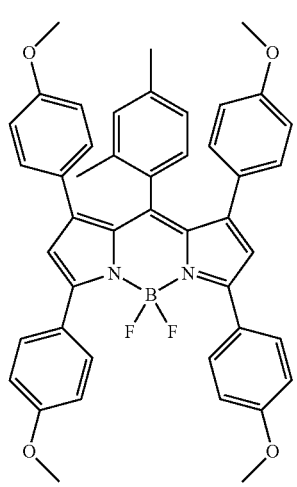
Compd (4)-49
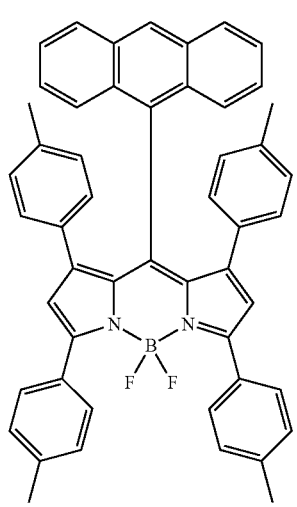
Compd (4)-50
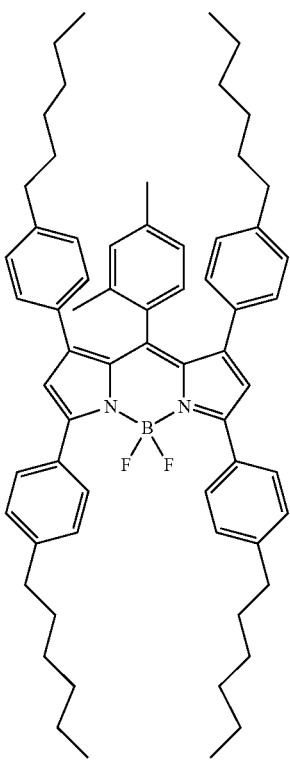
Compd (4)-51
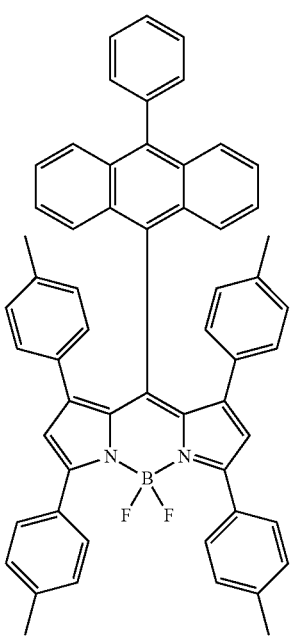

Compd (4)-52
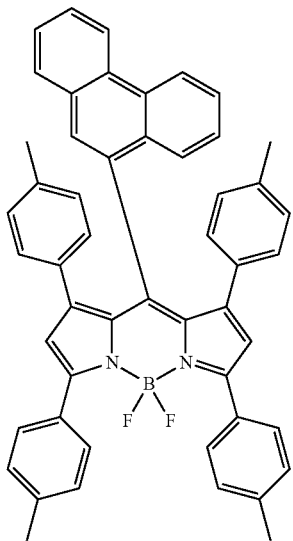
Compd (4)-53
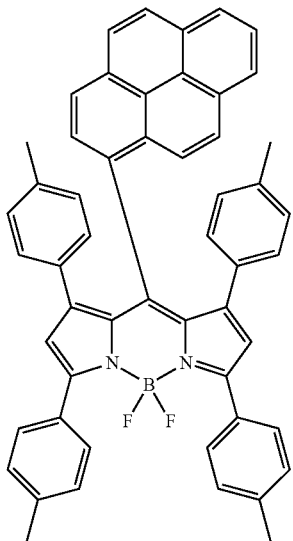
[Chemical 9-9]
Compd (4)-54
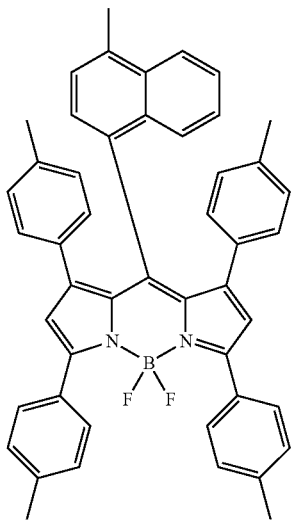
Compd (4)-55
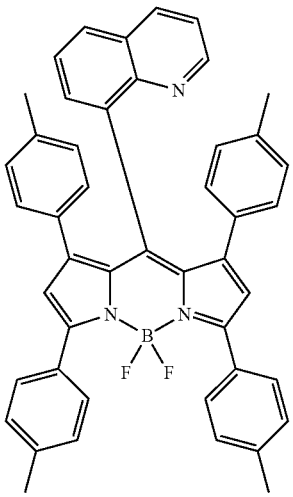
Compd (4)-56
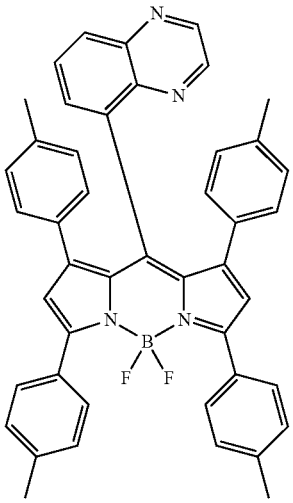
Compd (4)-57
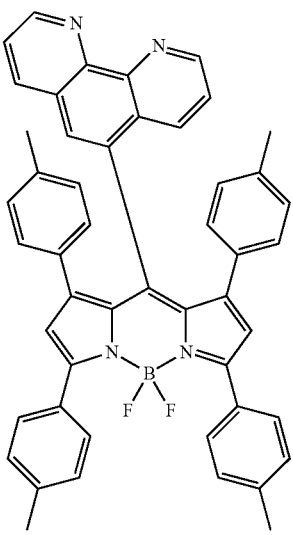

Compd (4)-58
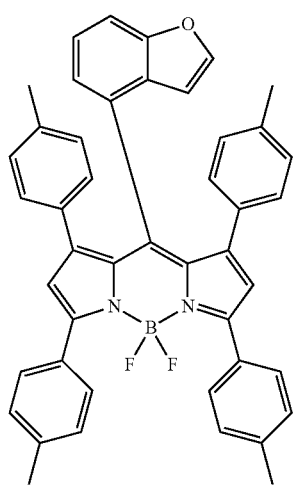
Compd (4)-59
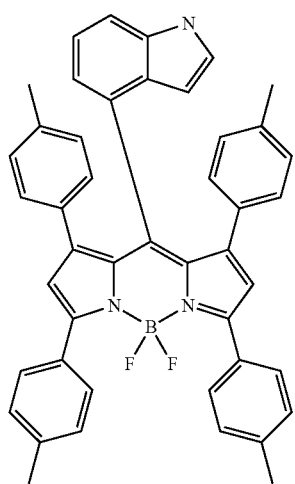
Compd (4)-60
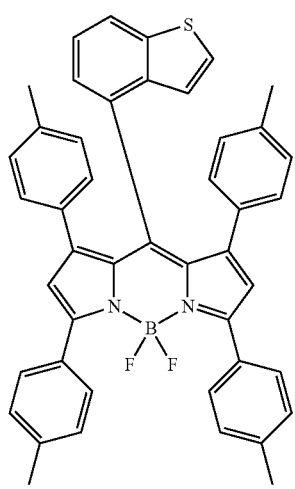
Compd (4)-61
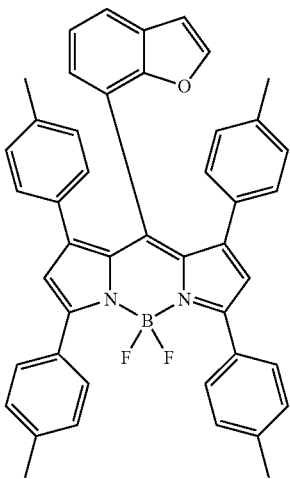
Compd (4)-62
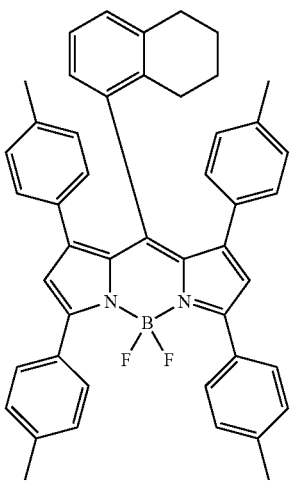
[Chemical 9-10]
Compd (4)-63
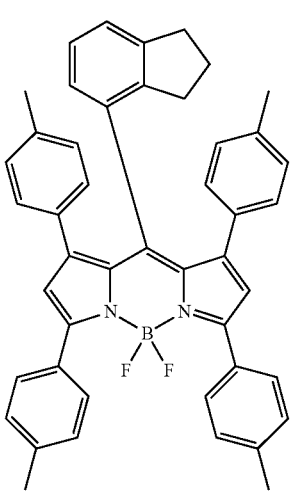

Compd (4)-64
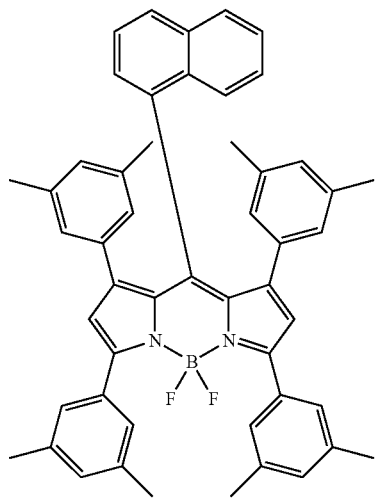
Compd (4)-65
Compd (4)-66
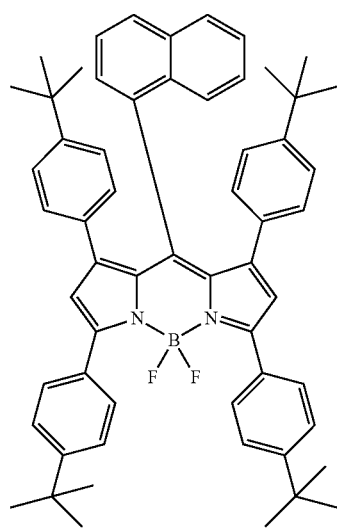
Compd (4)-67
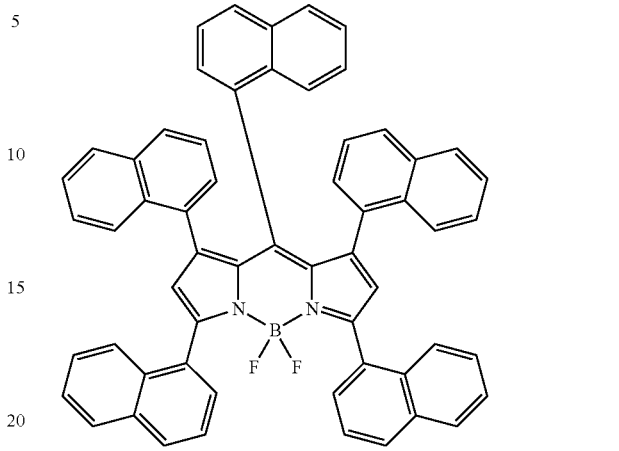
Compd (4)-68
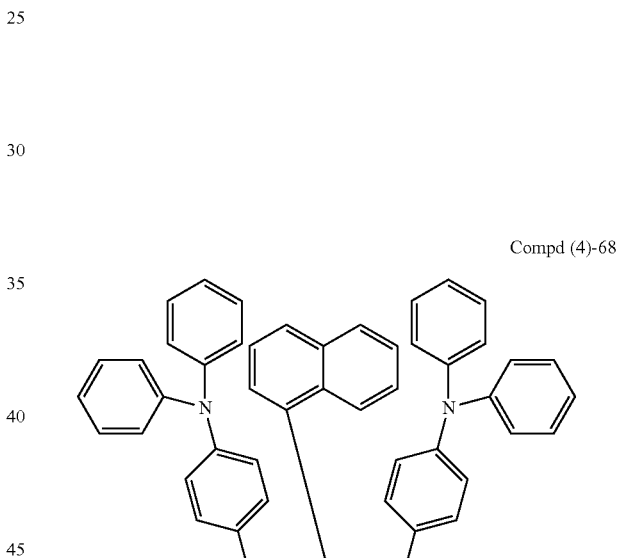
Pyran Derivative
As the red light emitting guest material, there is used, for example, a compound (pyran derivative) represented by the following general formula (5).

[Chemical 10]

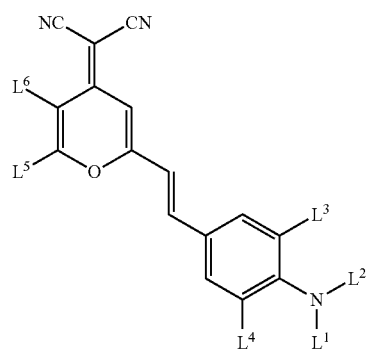

General Formula (5)

In the general formula (5), $L^1$ to $L^6$ each independently represent hydrogen, a substituted or unsubstituted alkyl group of up to 20 carbon atoms, a substituted or unsubstituted alkenyl group of up to 20 carbon atoms, a substituted or unsubstituted alkoxyl group of up to 20 carbon atoms, cyano group, nitro group, a substituted or unsubstituted silyl group of up to 30 carbon atoms, a substituted or unsubstituted aryl group of up to 30 carbon atoms, a substituted or unsubstituted heterocyclic group of up to 30 carbon atoms, or a substituted or unsubstituted amino group of up to 30 carbon atoms. In addition, $L^1$ and $L^4$, or $L^2$ and $L^3$, may form a cyclic structure through a hydrocarbon.

Incidentally, the substituted or unsubstituted aryl groups represented by $L^1$ to $L^6$, the heterocyclic groups represented by $L^1$ to $L^6$, and the amino groups represented by $L^1$ to $L^6$, in the general formula (5), are the same as those groups indicated above in relation to the perylene derivative of the general formula (2). Here, $L^1$ and $L^4$, or $L^2$ and $L^3$, may form a cyclic structure through a hydrocarbon. In addition, two or more of the above-mentioned substituent groups may form a condensed ring, and may have a substituent group.

Specific examples of the pyran derivative used preferably as the red light emitting guest material in the light emitting layer 14c include the following Compounds (5)-1 to (5)-7. It is to be noted, however, that the present invention is not limited to these compounds.

[Chemical 11]

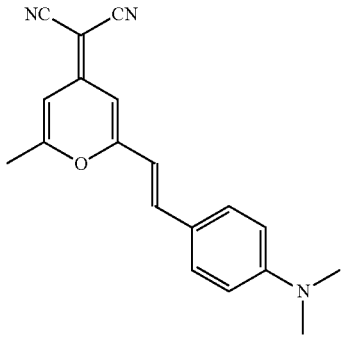

Compd (5)-1

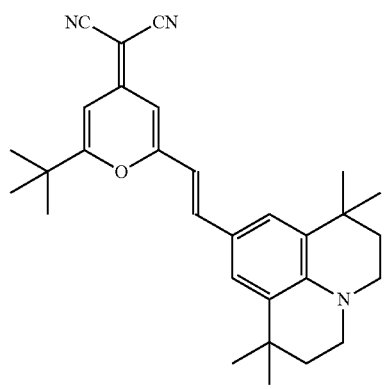

Compd (5)-2

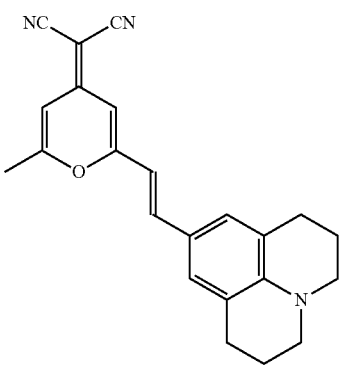

Compd (5)-3

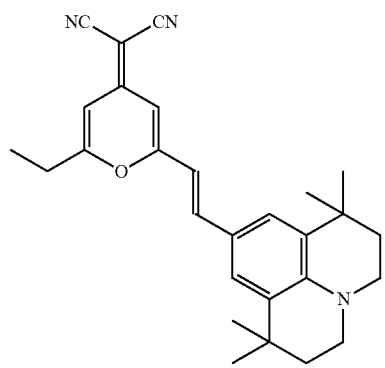

Compd (5)-4

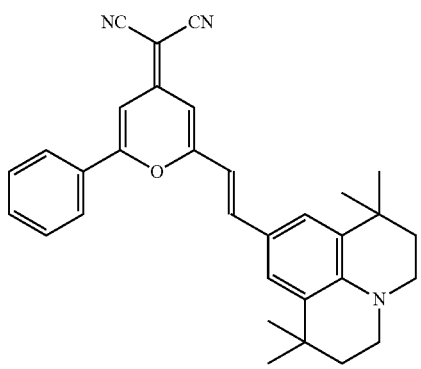

Compd (5)-5

Compd (5)-6

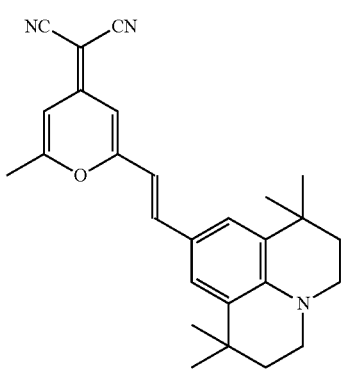

Compd (5)-7

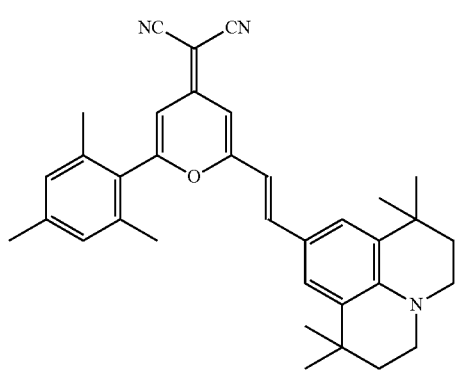

Styryl Derivative

As the red light emitting guest material, there is used, for example, a compound (styryl derivative) represented by the following general formula (6).

[Chemical 12]

General Formula (6)

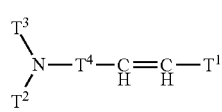

In the general formula (6), $T^1$ to $T^3$ each represent a substituted or unsubstituted aryl group of up to 30 carbon atoms or a substituted or unsubstituted heterocyclic group of up to 30 carbon atoms. In addition, T4 represents a substituted or unsubstituted phenylene moiety which may form a cyclic structure with $T^2$ and $T^3$.

The substituted or unsubstituted aryl groups represented by $T^1$ to $T^3$ and the heterocyclic groups represented by $T^1$ to $T^3$, in the general formula (6), are the same as those groups indicated above in relation to the perylene derivative of the general formula (2).

Incidentally, two or more of the above-mentioned substituent groups may form a condensed ring, and may further have a substituent group. In this case, examples of the group substituted on $T^1$ to $T^4$ include hydrogen, halogen, hydroxyl group, a substituted or unsubstituted carbonyl group of up to 20 carbon atoms, a substituted or unsubstituted carbonyl ester group of up to 20 carbon atoms, a substituted or unsubstituted alkyl group of up to 20 carbon atoms, a substituted or unsubstituted alkenyl group of up to 20 carbon atoms, a substituted or unsubstituted alkoxyl group of up to 20 carbon atoms, cyano group, nitro group, and amino group. In addition, the amino group may be any of alkylamino groups, arylamino groups, aralkylamino groups, etc. These groups preferably have an aliphatic group of a total of 1 to 6 carbon atoms and/or 1 to 4 aromatic carbon rings. Examples of such a group include dimethylamino group, diethylamino group, dibutylamino group, diphenylamino group, ditolylamino group, bisbiphenylylamino group, and dinaphthylamino group.

Specific examples of the styryl derivative used preferably as the red light emitting guest material in the light emitting layer 14c include the following Compounds (6)-1 to (6)-35. It is to be noted, however, that the present invention is not limited to these compounds in any way.

[Chemical 13-1]

Compd (6)-1

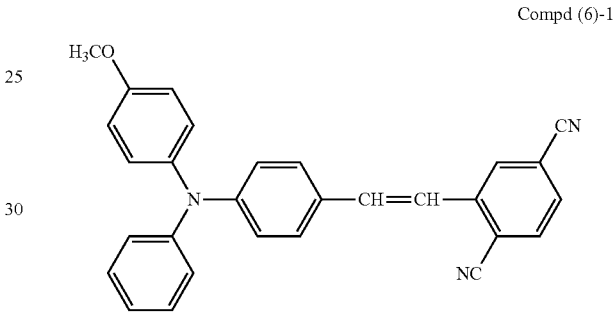

Compd (6)-2

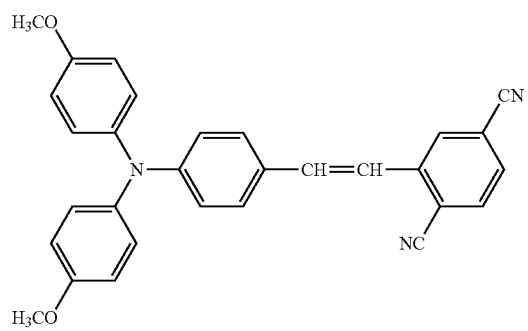

Compd (6)-3

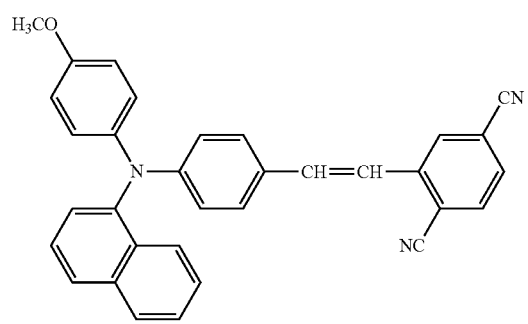

-continued
Compd (6)-4
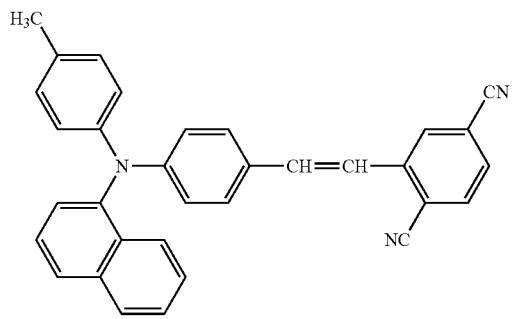
Compd (6)-5
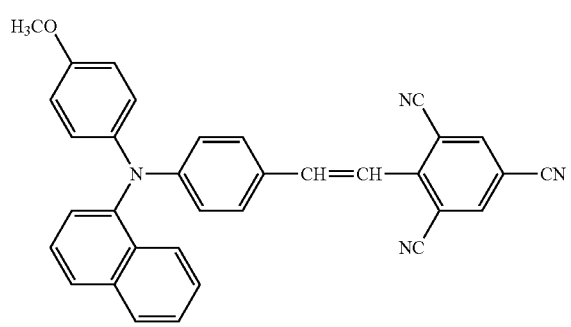
Compd (6)-6
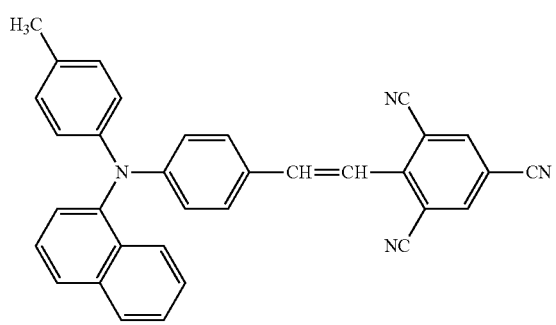
Compd (6)-7
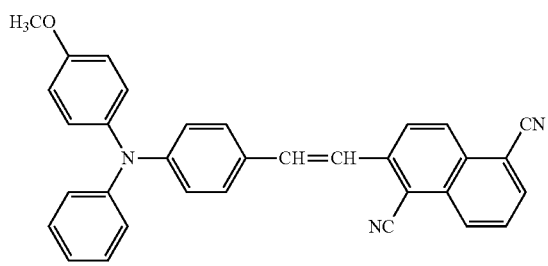
Compd (6)-8
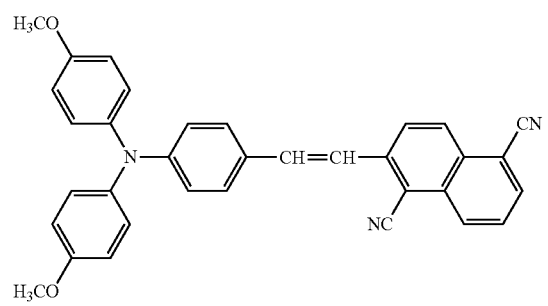
[Chemical 13-2]
Compd (6)-9
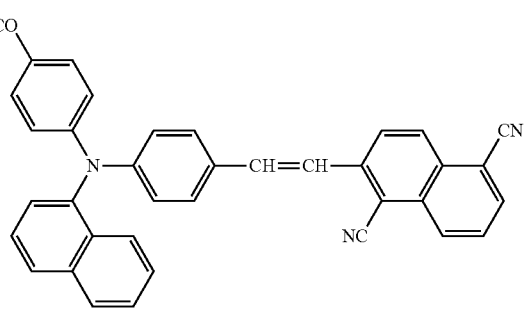
Compd (6)-10
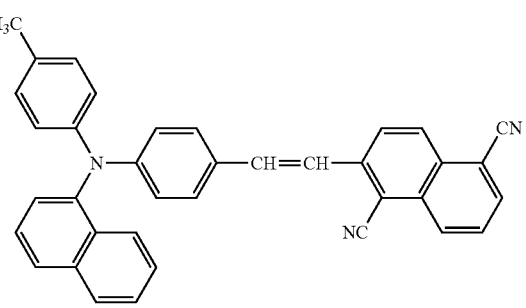
Compd (6)-11
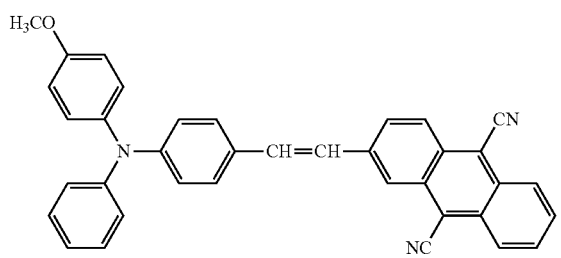
Compd (6)-12
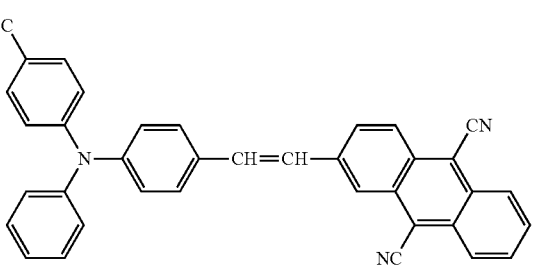
Compd (6)-13
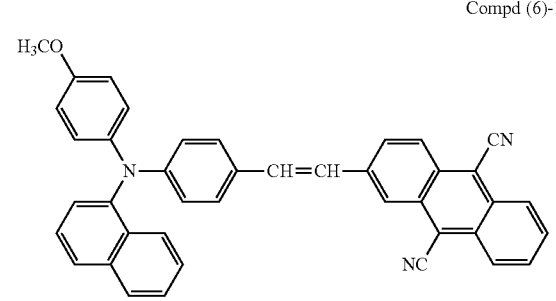

[Chemical 13-3]
Compd (6)-14
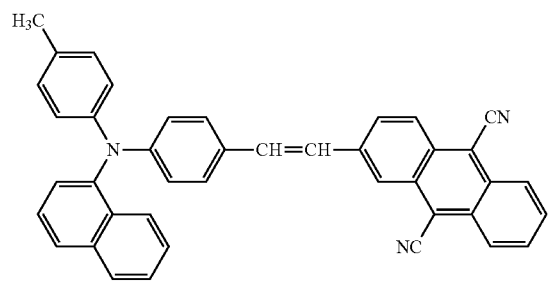
Compd (6)-15
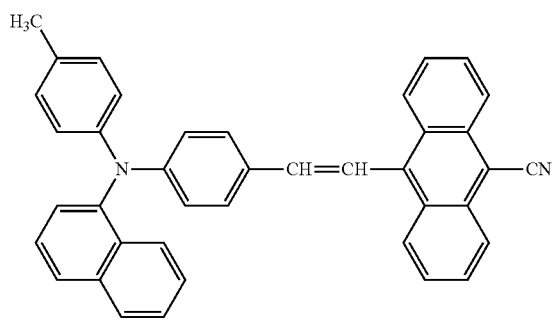
Compd (6)-16
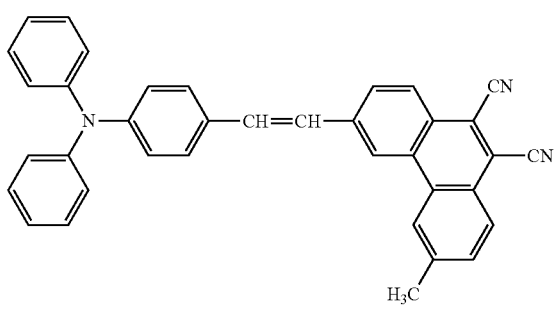
Compd (6)-17
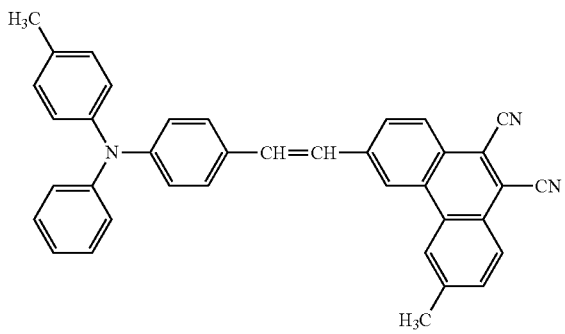
Compd (6)-18
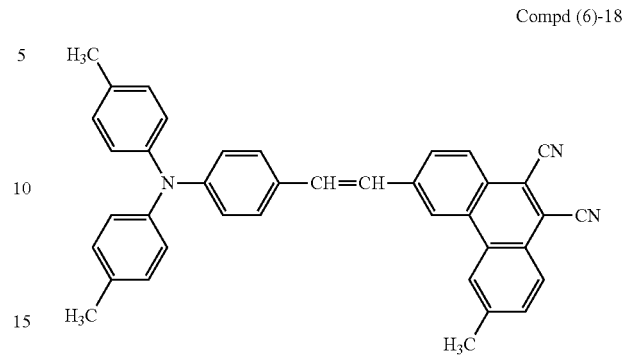
Compd (6)-19
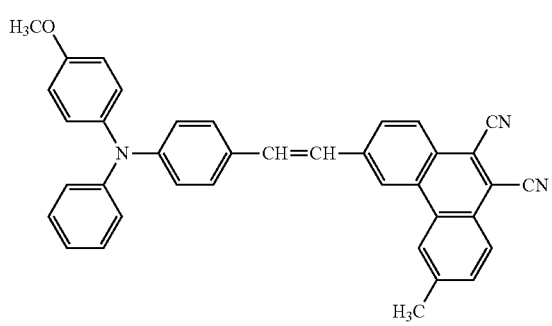
Compd (6)-20
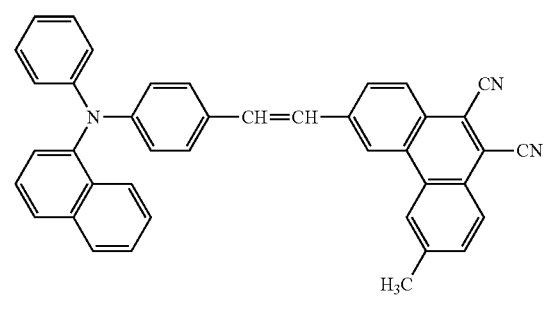
Compd (6)-21

Compd (6)-22
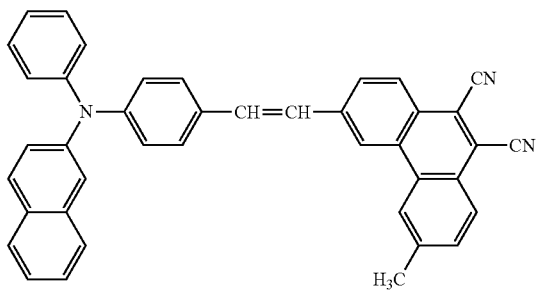
Compd (6)-23
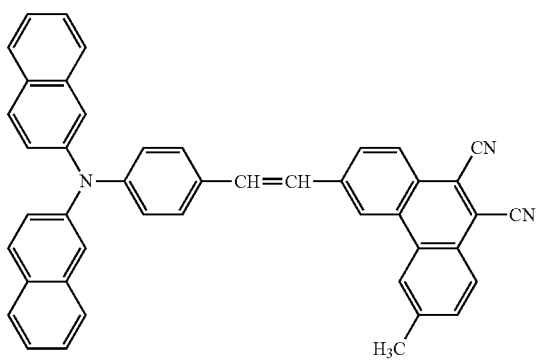
Compd (6)-24
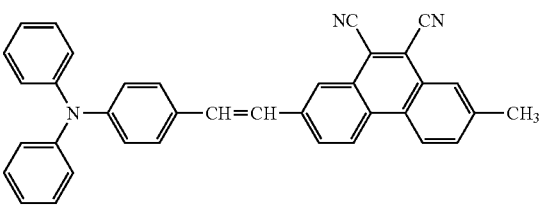
Compd (6)-25
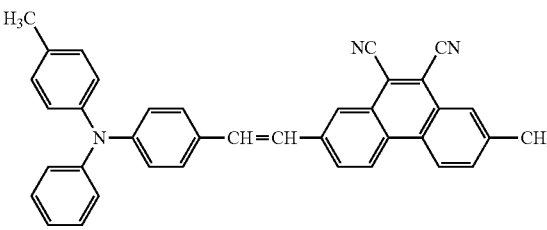
[Chemical 13-4]
Compd (6)-26
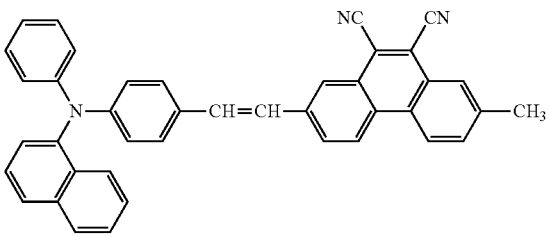
Compd (6)-27
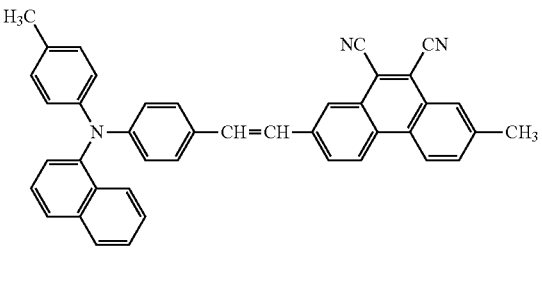
Compd (6)-28
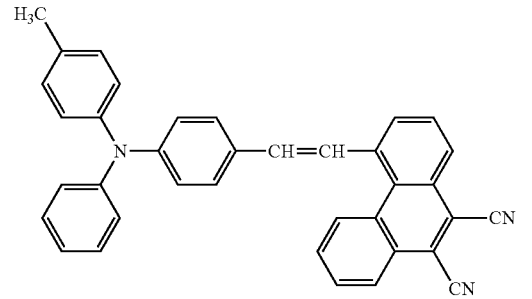
Compd (6)-29
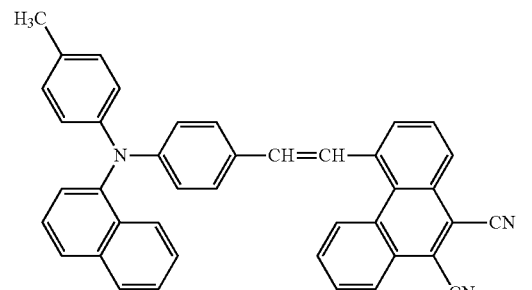
Compd (6)-30
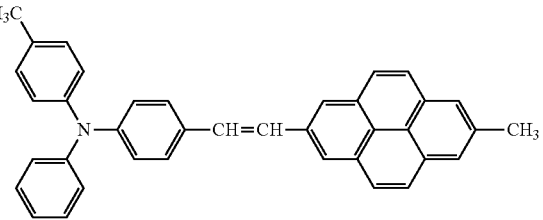
Compd (6)-31
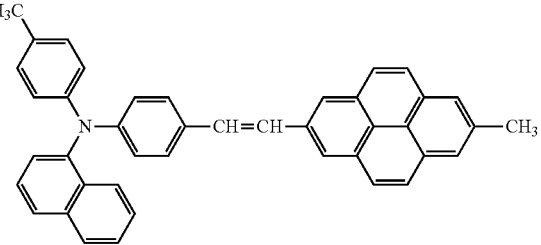

-continued

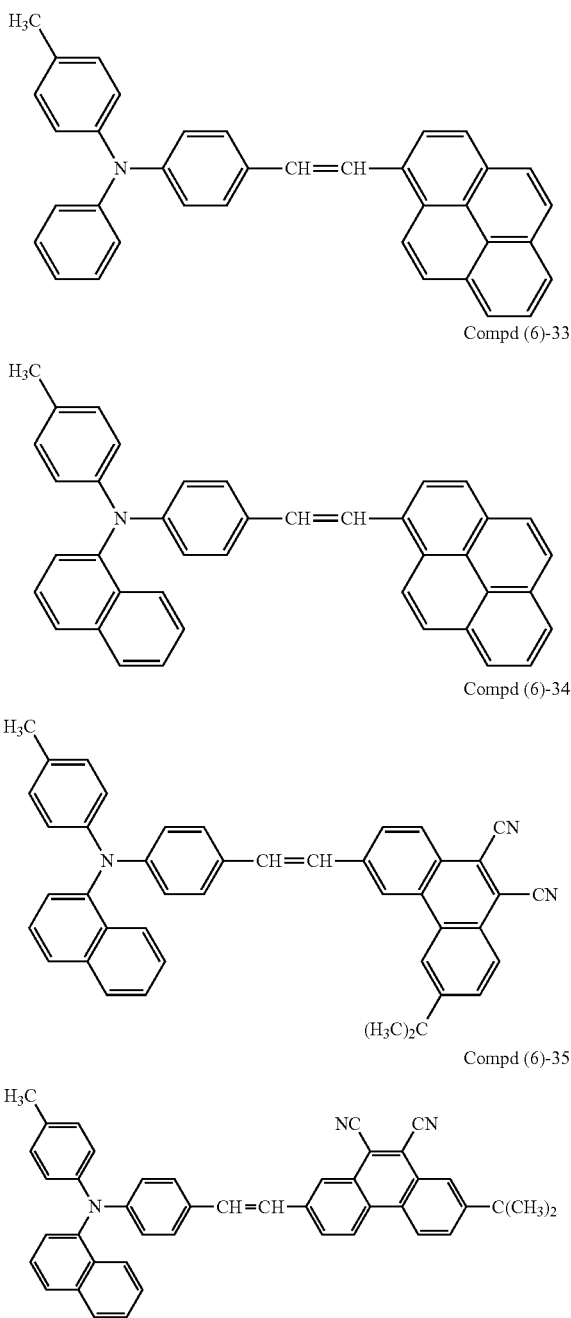

Incidentally, the perylene derivatives of the general formula (2), the diketopyrrolopyrrole derivatives of the general formula (3), the pyrromethene complexes of the general formula (4), the pyran derivatives of the general formula (5), or the styryl derivatives of the general formula (6), to be used as the red light emitting guest material in the light emitting layer 14c as above-described are preferably those having a molecular weight of not more than 2000, more preferably not more than 1500, and particularly preferably not more than 1000. The reason lies in that if the molecular weight is too high, there would be a fear that vapor deposition properties in fabrication of the devices by vapor deposition would be worsened.

<Photosensitizing Layer>

The photosensitizing layer 14d is a layer for transferring energy into the light emitting layer 14c and thereby enhancing the luminous efficiency of the light emitting layer 14c. In the present embodiment, it is a characteristic feature that the photosensitizing layer 14d is configured by use of a phosphorescent material. Consequently, since the phosphorescent material which in principle is higher than the fluorescent material in luminous efficiency is used as the photosensitizing layer, the luminous efficiency from the light emitting layer 14c can be drastically enhanced.

Such a photosensitizing layer 14d has a guest-host relationship in which the phosphorescent material is used as a light emitting guest material and the host material is doped with the light emitting guest material.

As the phosphorescent material (light emitting guest material) constituting the photosensitizing layer 14d, of the above-mentioned host and guest materials, there is preferably used a phosphorescent material which shows phosphorescence at a wavelength shorter than the wavelength of red light generated in the light emitting layer 14c containing the red light emitting guest material.

Figure 2:
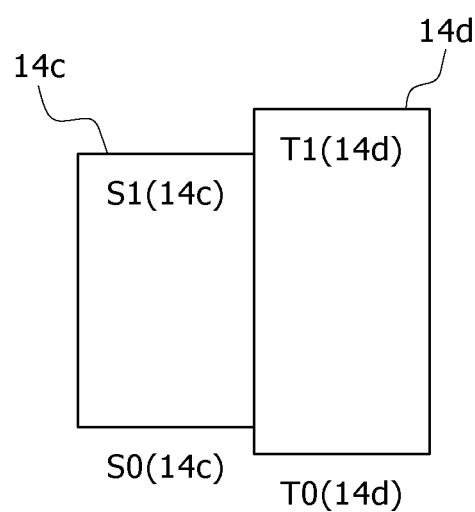
FIG. 2 is a schematic diagram of energy level, for a light emitting guest material contained in a light emitting layer and for a phosphorescent material (light emitting guest material) contained in a photosensitizing layer, in the organic electroluminescence device according to the embodiment.

FIG. 2 shows a schematic diagram of energy level for the light emitting guest material contained in the light emitting layer 14c and for the phosphorescent material (light emitting guest material) contained in the photosensitizing layer 14d. As shown in the diagram, the light emitting guest material contained in the light emitting layer 14c is assumed to have a singlet excited state $S1(14c)$ and a ground state $S0(14c)$. On the other hand, the phosphorescent material (light emitting guest material) contained in the photosensitizing layer 14d is assumed to have a triplet excited state $T1(14d)$ and a ground state $S0(14d)$. Then, it is desirable that the energy differences between the respective excited state and ground state are in the relationship of $|T1(14d)-S0(14d)|>|S1(14c)-S0(14c)|$.

This shows that the wavelength of the phosphorescence in the photosensitizing layer 14d is shorter than the wavelength of the emitted light generated in the light emitting layer 14c. When this relationship is satisfied, the energy generated in the photosensitizing layer 14d is efficiently transferred into the light emitting layer 14c, whereby enhancement of luminous efficiency can be contrived.

Specific examples of the phosphorescent materials as above are selected from among iridium complexes, platinum complexes, rhenium complexes, osmium complexes, ruthenium complexes, and gold complexes. Besides, it is preferable to select from these materials a phosphorescent material having high luminous efficiency and to use it; for example, the phosphorescent material is selected from among iridium complexes.

On the other hand, the host material constituting the photosensitizing layer 14d is an organic material having a derivative of an aromatic hydrocarbon of 6 to 60 carbon atoms or having a connected body of such aromatic hydrocarbon derivatives. Specific examples of the organic material include carbazole derivatives, indene derivatives, phenanthrene derivatives, pyrene derivatives, naphthacene derivatives, triphenylene derivatives, anthracene derivatives, perylene derivatives, picene derivatives, fluoranthene derivatives, acephenanthrylene derivatives, pentaphene derivatives, pentacene derivatives, coronene derivatives, butadiene derivatives, stilbene derivatives, tris(8-quinolinolato)aluminum complex, and bis(benzoquinolinolato)beryllium complex.

Of the above-mentioned host materials, a host material promising a highest luminous efficiency is selectively used on the basis of each light emitting guest material. As the host material, carbazole derivatives are used preferably.

In addition, it is important that the photosensitizing layer 14d configured as above is provided in contact with the light emitting layer 14c. Therefore, the photosensitizing layer 14d is provided, for example, between the light emitting layer 14c and the cathode 15. However, since it is important for the photosensitizing layer 14d to be provided in contact with the light emitting layer 14c, the photosensitizing layer 14d may be provided between the light emitting layer 14c and the anode 13 in the state of making contact with the light emitting layer 14c.

<Electron Transport Layer>

The electron transport layer 14e is for transporting to the light emitting layer 14c the electrons injected from the cathode 15. Examples of the material constituting the electron transport layer 14e include quinoline, perylene, phenanthroline, bisstyryl, pyrazine, triazole, oxazole, oxadiazole, fluorenone, and their derivatives and their metal complexes. Specific examples include tris(8-hydroxyquinoline) aluminum (abbreviated to Alq3), anthracene, naphthalene, phenanthrene, pyrene, anthracene, perylene, butadiene, cumarin, acridine, stilbene, 1,10-phenanthroline, and their derivatives and their metal complexes.

Incidentally, the organic layer 14 is not limited to such a layer structure, insofar as at least the light emitting layer 14c and the photosensitizing layer 14d in contact therewith are provided; other than this point, a stacked structure may be selected, as required.

Besides, the light emitting layer 14c may be provided in the organic electroluminescence device 11 as a hole transporting light emitting layer, an electron transporting light emitting layer, or a both charge transporting light emitting layer. Further, each of the layers constituting the organic layer 14 as above, for example, the hole injection layer 14a, the hole transport layer 14b, the light emitting layer 14c, the photosensitizing layer 14d, and the electron transport layer 14e may have a stacked structure including a plurality of layers.

<Cathode>

In the next place, the cathode 15 provided over the organic layer 14 configured as above is composed, for example, of a two-layer structure in which a first layer 15a and a second layer 15b are stacked in this order from the organic layer 14 side.

The first layer 15a is configured by use of a material which has a low work function and good light transmittance. Examples of the material which can be used here include lithium oxide ($Li_2O$), which is an oxide of lithium (Li), cesium carbonate ($Cs_2CO_3$), which is a composite oxide of cesium (Cs), and, further, a mixture of the oxide and the composite oxide. Besides, the first layer 15a is not limited to these materials. There may be used alkaline earth metals such as calcium (Ca), barium (Ba), etc., alkali metals such as lithium, cesium, etc., metals with low work function such as indium (In), magnesium (Mg), etc., and oxides, composite oxides, fluorides and the like of these metals, which may be used either singly or may be used in the state of a mixture of these metals, oxides, composite oxides, fluorides and the like or in the state of an alloy thereof, for the purpose of enhancing stability thereof.

The second layer 15b has a thin film using a light-transmitting layer such as a layer of MgAg. The second layer 15b may be a mixture layer which further contains, an organic light emitting material such as an aluminum quinoline complex, a styrylamine derivative, a phthalocyanine derivative, etc. In this case, a light-transmitting layer such as a layer of MgAg may be separately provided as a third layer.

In the case where the driving system of the display apparatus configured by use of the organic electroluminescence devices 11 is an active matrix system, the cathode 15 as above-mentioned is formed in a solid pattern on the substrate 12 in the state of being insulated from the anode 13 by the organic layer 14 and the above-mentioned insulating film not shown here, to be used as a common electrode for pixels.

Incidentally, it is obvious that the cathode 15 is not limited to the above-mentioned stacked structure and it suffices for the cathode 15 to take an optimum combined or stacked structure according to the structure of the device fabricated. For example, the configuration of the cathode 15 in the above-described embodiment is a stacked structure in which functions of the layers of the electrodes are separated, in other words, an inorganic layer (first layer 15a) for acceleration of electron injection into the organic layer 14 and an inorganic layer (second layer 15b) for controlling the electrodes are separated from each other. However, the inorganic layer for acceleration of electron injection into the organic layer 14 may serve also as the inorganic layer for controlling the electrodes, and these layers may be configured in a monolayer structure. In addition, a stacked structure may be adopted in which a transparent electrode of ITO or the like is formed over the monolayer structure.

A current applied to the organic electroluminescence device 11 configured as above is normally a direct current; however, a pulsed current or an alternating current may also be used. The current value and the voltage value are not particularly limited insofar as they are within such ranges that the devices would not be broken. Taking into account the power consumption and useful life of the organic electroluminescence devices, however, it is desirable to cause the organic electroluminescence devices to emit light efficiently with an electrical energy as small as possible.

In addition, in the case where the organic electroluminescence devices 11 have a cavity structure, the cathode 15 is configured by use of a semi-transmitting semi-reflective material. Then, emitted light having undergone multiple beam interference between a light reflective surface on the anode 13 side and a light reflective surface on the cathode 15 side is emitted from the cathode 15 side. In this case, the optical distance between the light reflective surface on the anode 13 side and the light reflective surface on the cathode 15 side is determined according to the wavelength of the light to be emitted, and the film thicknesses of the layers are so set as to satisfy the optical distance. In the organic electroluminescence device of the top emission type thus configured, it is possible by positive use of the cavity structure to improve the efficiency of emission of light to the exterior and to control the emission spectrum. Besides, there is an effect to prevent phosphorescent light of a wavelength shorter than the red emitted light generated in the photosensitizing layer 14d from being taken out from the cathode 15 side.

Further, through omitted in the drawing here, the organic electroluminescence device 11 configured as above is preferably used in the state of being covered with a protective layer (passivation layer) for preventing organic materials from being deteriorated due to moisture, oxygen or the like present in the atmospheric air. As the protective film, there is used a silicon nitride (representatively, $Si_3N_4$) film, a silicon oxide (representatively, $SiO_2$) film, a silicon nitroxide (SiNxOy: compositional ratio X>Y) film, a silicon oxynitride (SiOxNy: composition ratio X>Y) film, or a thin film containing a carbon as a main constituent such as DLC (Diamond Like Carbon), a CN (Carbon Nanotube) film or the like. These films are preferably configured to be monolayer or a stacked layer. Among others, a protective film composed of a nitride is preferably used, since the film is dense and exhibits an extremely high blocking effect on moisture, oxygen and other impurities which would otherwise exert bad influences on the organic electroluminescence device 11.

Incidentally, in the present embodiment as above, the present invention has been described in detail by showing as an example the case where the organic electroluminescence device is of the top emission type. However, the organic electroluminescence device according to the present invention is not limited to application to the top emission type, and is widely applicable to configurations in which an organic layer having at least a light emitting layer is sandwiched between an anode and a cathode. Therefore, the organic electroluminescence device of the present invention is also applicable to an organic electroluminescence device of a configuration in which a cathode, an organic layer, and an anode are sequentially layered in this order from the side of a substrate, and an organic electroluminescence device of a bottom emission type in which an electrode located on the substrate side (a lower electrode as cathode or anode) is composed of a transparent material whereas an electrode located on the side opposite to the substrate (an upper electrode as cathode or anode) is composed of a reflective material, whereby light is taken out only from the lower electrode side.

Furthermore, the organic electroluminescence device of the present invention may be any device that is formed by providing a pair of electrodes (anode and cathode) and an organic layer sandwiched between the electrodes. Accordingly, the organic electroluminescence device of the invention is not limited to those configured by use of only a pair of electrodes and an organic layer, and does not exclude the coexistence of other components (for example, an inorganic compound layer or an inorganic constituent) within such a range as not to spoil the effect of the invention.

It has been confirmed that in the organic electroluminescence device 11 configured as above-described, current efficiency is enhanced as compared with a device with a configuration where the photosensitizing layer 14d is not provided, as will be detailed in the Examples later.

Moreover, notwithstanding the structure in which the green light emitting photosensitizing layer 14d is stacked over the red light emitting layer 14c, mixing of colors due to light emission from the photosensitizing layer 14d would not occur even upon application of an electric field, and red emitted light can be obtained. The reason is considered as follows. Although the holes passing through the red light emitting layer 14c and the electrons injected through the electron transport layer 14e are recombined in the photosensitizing layer 14d, the energy released by the recombination may so act as to excite electrons in the host material constituting the red light emitting layer 14c adjacent to the photosensitizing layer 14d, thereby contributing to emission of light in the red light emitting layer 14c. Incidentally, such a phenomenon as this can be inferred from a phenomenon in which the objective red light emitting layer would rarely emit light in the case where the photosensitizing layer 14d is composed only of the host material, as shown in Comparative Examples described in contrast to Examples later.

From the foregoing, it is seen that according to the organic electroluminescence device 11 as above-described, it is possible to contrive enhancement of luminous efficiency of the red emitted light while maintaining color purity.

In addition, by such a remarkable improvement in luminous efficiency, it is possible to achieve both enhancement of luminance life and a reduction in power consumption in the organic electroluminescence device 11.

<<General Configuration of Display Apparatus>>

Figure 3:
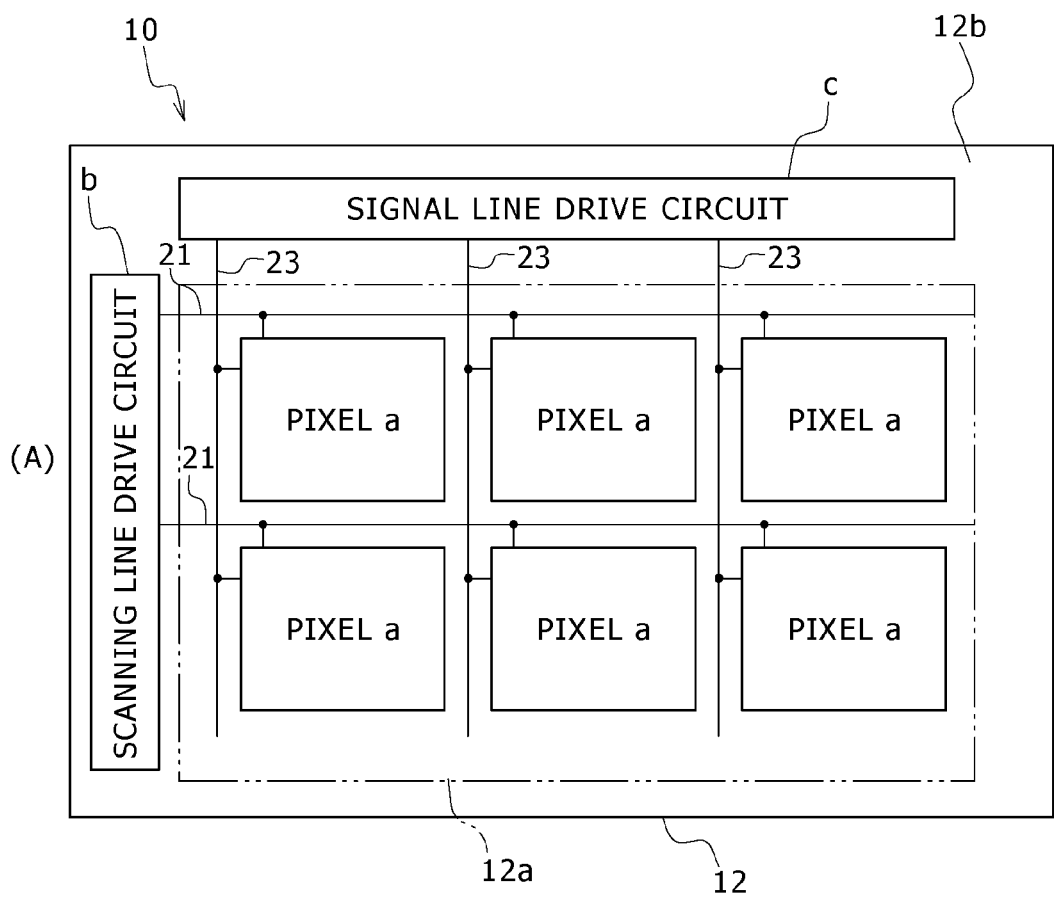
FIG. 3 shows diagrams illustrating an example of circuit configuration of a display apparatus according to an embodiment.
Figure 3:
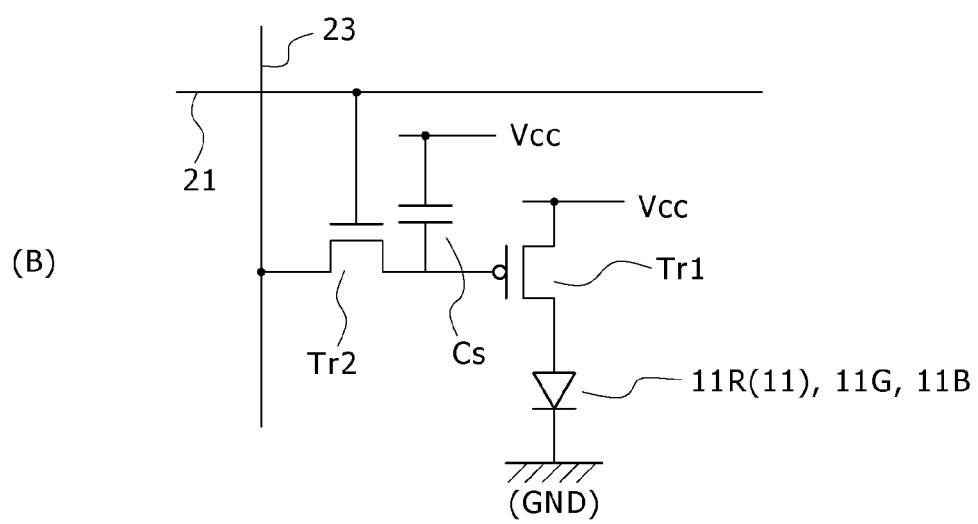

FIG. 3 illustrates an example of a display apparatus 10 in an embodiment, wherein FIG. 3(A) is a schematic block diagram, and FIG. 3(B) is a block diagram of a pixel circuit. Here, an embodiment in which the present invention is applied to a display apparatus 10 of an active matrix system using an organic electroluminescence device 11 as a light emitting device will be described.

As shown in FIG. 3(A), a display area 12a and a peripheral area 12b surrounding it are set on a substrate 12 in the display apparatus 10. The display area 12a is configured as a pixel array area in which a plurality of scanning lines 21 and a plurality of signal lines 23 are arrayed in column and row directions and in which one pixel a is provided correspondingly to each of intersections of the scanning lines 21 and the signal lines 23. One of organic electroluminescence devices 11R (11), 11G, and 11B is provided at each pixel a. Besides, a scanning line drive circuit b for scan driving of the scanning lines 21 and a signal line drive circuit c for supplying the signal lines 23 with video signals (or input signals) according to luminance information are arranged in the peripheral area 12b.

As shown in FIG. 3(B), a pixel circuit provided in each pixel a is composed, for example, of one of the organic electroluminescence devices 11R (11), 11G, and 11B, a drive transistor Tr1, a write transistor (sampling transistor) Tr2, and a holding capacitor Cs. With driving by the scanning line drive circuit b, a video signal written from the signal line 23 through the write transistor Tr2 is held by the holding capacitor Cs, and a current according to the amount of signal thus held is supplied to each of the organic electroluminescence devices 11R (11), 11G, and 11B, resulting in that each of the organic electroluminescence devices 11R (11), 11G, and 11B emits light with a luminance according to the current value.

Incidentally, the configuration of the pixel circuit as above is merely one example. The pixel circuit may be configured by providing a capacitance element in the pixel circuit or, further, by providing a plurality of transistors, in the pixel circuit, as required. Besides, in the peripheral area 12b, required drive circuits are added according to modifications in the pixel circuit.

<<Sectional Configuration-1 of Display Apparatus>>

Figure 4:
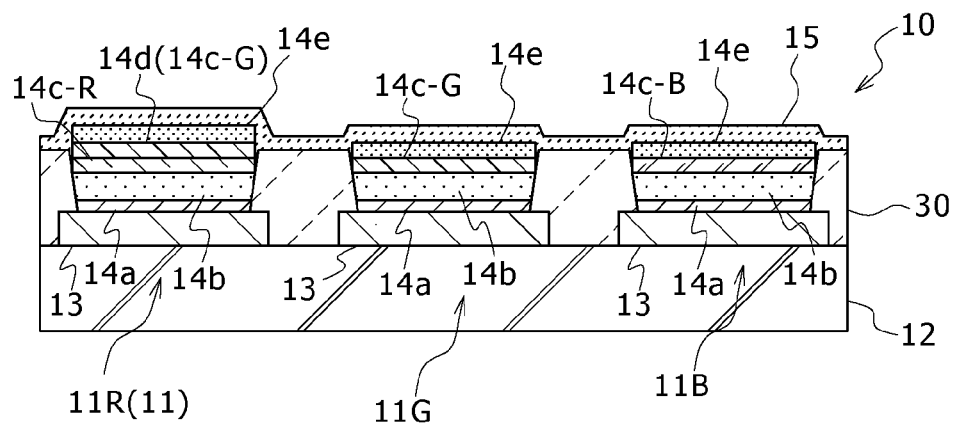
FIG. 4 illustrates a first example of sectional configuration of a major part in the display apparatus according to the embodiment.

FIG. 4 illustrates a first example of sectional configuration of a major part of the display area of the above-mentioned display apparatus 10.

In the display area of the substrate 12 provided with the organic electroluminescence devices 11R (11), 11G, and 11B, though not shown there are provided drive transistors, write transistors, scanning lines, and signal lines so as to constitute the above-mentioned pixel circuits (see FIG. 3), and an insulating film is provided in the state of covering these components.

The organic electroluminescence devices 11R (11), 11G, and 11B are formed in array on the substrate 12 covered with the insulating film. Each of the organic electroluminescence devices 11R (11), 11G, and 11B is configured as a device of the top emission type in which light is taken out from the side opposite to the substrate 12.

The anode 13 of each of the organic electroluminescence devices 11R (11), 11G, and 11B is patterned on the basis of each device. Each anode 13 is connected to the drive transistor in the pixel circuit through a connection hole formed in the insulating film covering the surface of the substrate 12.

A peripheral portion of each anode 13 is covered with an insulating film 30 so that a central portion of the anode 13 is exposed in an aperture portion provided in the insulating film 30. The organic layer 14 is patterned in the state of covering the exposed portions of the anodes 13, and the cathode 15 is provided as a common layer covering the organic layers 14.

Of the organic electroluminescence devices 11R (11), 11G, and 11B, particularly the red light emitting device 11R is configured as the organic electroluminescence device (11) in the embodiment described using FIG. 1 above. On the other hand, the green light emitting device 11G and the blue light emitting device 11B may be of an ordinary device configuration.

Specifically, in the red light emitting device 11R (11), the organic layer 14 provided on the anode 13 includes, for example, a hole injection layer 14a, a hole transport layer 14b, a red light emitting layer 14c-R (14c) using a naphthacene derivative as a host material, a photosensitizing layer 14d in which a host material is doped with a light emitting guest material for emitting light in a green region, and an electron transport layer 14e layered in this order from the anode 13 side.

On the other hand, the organic layers in the green light emitting device 11G and the blue light emitting device 11B each include, for example, a hole injection layer 14a, a hole transport layer 14b, a light emitting layer 14c-G or 14c-B for each color, and an electron transport layer 14e layered in this order from the anode 13 side.

Incidentally, the photosensitizing layer 14d in the red light emitting device 11R (11) is doped with a green phosphorescent material serving as a light emitting guest material; for example, the configuration (material) of this photosensitizing layer 14d may be same as or different from that of the green light emitting layer 14c-G in the green light emitting device 11G. In addition, each of the other layers than the light emitting layers 14c-R, 14c-G, 14c-B and the photosensitizing layer 14d may be configured by use of the same material in all the organic electroluminescence devices 11R, 11G, 11B inclusive of the anode 13 and the cathode 15, and is hence configured by use of each material described referring to FIG. 1 above.

Besides, the plurality of the organic electroluminescence devices 11R (11), 11G, 11B provided in the above-mentioned manner are covered with a protective film (omitted in the drawing). Incidentally, the protective film is provided covering the whole body of the display area in which the organic electroluminescence devices 11R, 11G, 11B are provided.

Here, each layer in the range from the anode 13 to the cathode 15 constituting the red light emitting device 11R (11), the green light emitting device 11G, and the blue light emitting device 11B can be formed by a dry process such as a vacuum evaporation method, an ion beam method (EB method), a molecular beam epitaxy method (MBE method), a sputtering method, an organic vapor phase deposition (OVPD) method, etc.

In addition, the organic layer 14 patterned on the basis of each of the organic electroluminescence devices 11R (11), 11G, 11B as above-mentioned is formed, for example, by a transfer method or a vapor deposition method using a mask.

Furthermore, the organic layer 14c can be formed not only by the above-mentioned methods but also by a wet process, for example, a coating method such as laser transfer method, spin coating method, dipping method, doctor blade method, ejection coating method, spray coating method, etc. or a printing method such as ink jet method, offset printing method, relief printing method, intaglio printing method, screen printing method, microgravure coating method, etc., and combined use of dry process and wet process may be adopted according to the properties of the organic layers and the members.

In the display apparatus 10 according to the first example configured as above, the organic electroluminescence device (11) configured according to the present invention as described referring to FIG. 1 above is used as the red light emitting device 11R. The red light emitting device 11R (11) has a high luminous efficiency while retaining a red emitted light color, as above-mentioned. Therefore, by combining the red light emitting device 11R (11) with the green light emitting device 11G and the blue light emitting device 11B, it becomes possible to achieve full-color display with high color reproduction performance.

In addition, the use of the organic electroluminescence device (11) having a high luminous efficiency offers an effect to improve luminance life and reduce power consumption, in the display apparatus 10. Accordingly, the display apparatus 10 can be favorably used as a flat panel display for wall-mounted television sets and the like or as a flat luminescent body, and are applicable as a light source for copying machines, printers, etc., a light source for liquid crystal displays, measuring instruments, etc., display boards, marker lamps, and so on.

<<Sectional Configuration-2 of Display Apparatus>>

Figure 5:
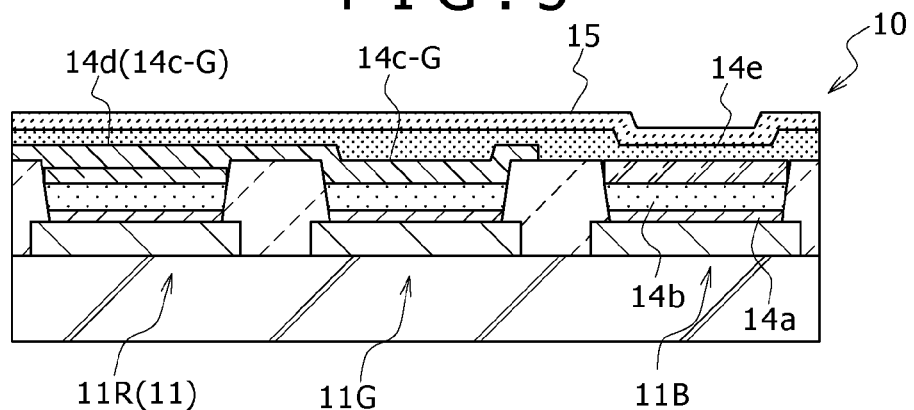
FIG. 5 illustrates a second example of sectional configuration of the major part in the display apparatus according to the embodiment.

FIG. 5 illustrates a second example of sectional configuration of a major part in the display area of the display apparatus 10.

The display apparatus 10 of the second example shown in FIG. 5 differs from the first example shown in FIG. 4 in that a photosensitizing layer 14d (14c-G) of a red light emitting device 11R (11) and a light emitting layer 14c-G of a green light emitting device 11G are formed as a common continuous pattern. Further, an electron transport layer 14e also is formed as a continuous pattern of a common layer for all pixels. In other points, the configuration of the second example is the same as the configuration of the first example.

Also in the display apparatus 10 of the second example configured as above, the same effect as that of the second example can be obtained. Further, the photosensitizing layer 14d (14c-G) and the light emitting layer 14c-G can be formed in a continuous pattern as a common layer in the organic electroluminescence devices 11R (11) and 11G. Furthermore, the electron transport layer 14e can be formed simultaneously for all pixels. Accordingly, simplification of manufacturing steps of the display apparatus 10 can be contrived.

<<Sectional Configuration-3 of Display Apparatus>>

Figure 6:
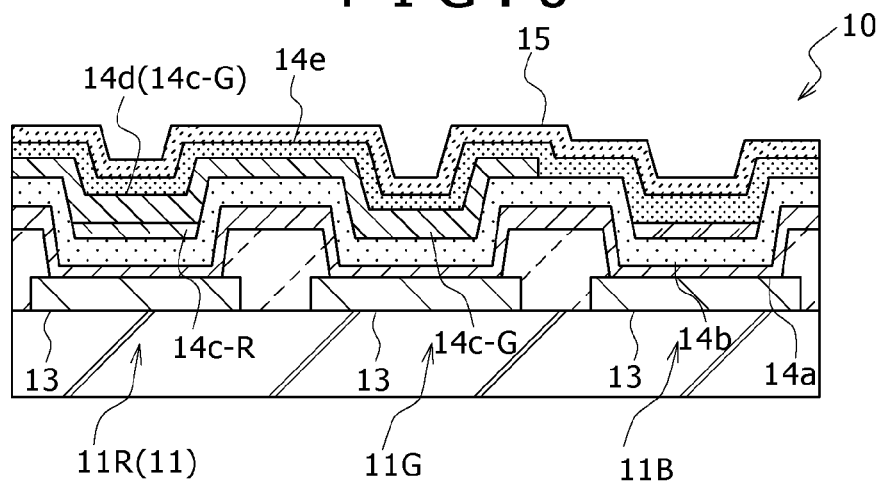
FIG. 6 illustrates a third example of sectional configuration of the major part in the display apparatus according to the embodiment.

FIG. 6 illustrates a third example of sectional configuration of a major part in the display area of the display apparatus 10.

In the display apparatus 10 of the third example shown in FIG. 6, other layers than an anode 13 and light emitting layers 14c-R, 14c-G, 14c-B are common layers in organic electroluminescence device 11R (11), 11G, 11B, and other configurations may be the same as those in the second example shown in FIG. 5. Thus, compared to the second example of FIG. 5, the hole injection layer 14a and the hole transport layer 14b below the light emitting layer are also used as common layers.

Also in the display apparatus 10 of the third example configured as above, the same effect as that of the second example can be obtained, and further simplification of manufacturing steps as compared with the second example can be contrived.

<<Sectional Configuration-4 of Display Apparatus>>

Figure 7:
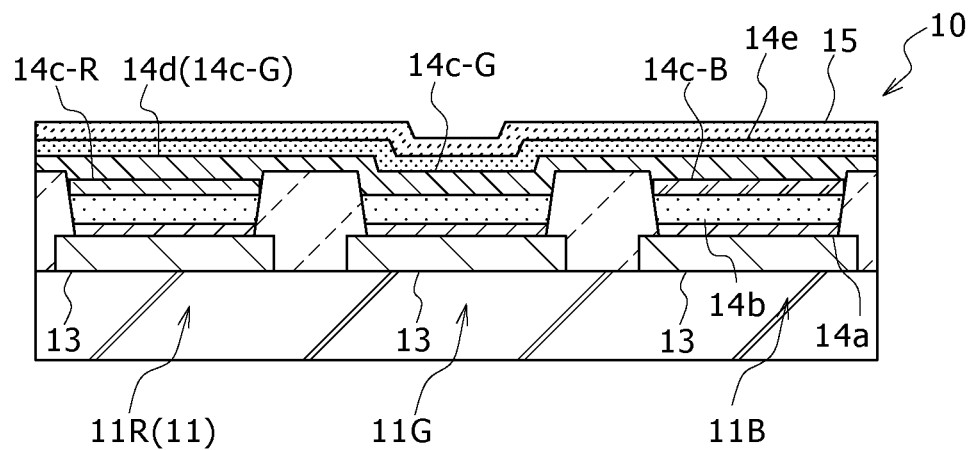
FIG. 7 illustrates a fourth example of sectional configuration of the major part in the display apparatus according to the embodiment.

FIG. 7 illustrates a fourth example of sectional configuration of a major part in the display area of the display apparatus 10.

As shown in the figure, in organic electroluminescence devices 11R, 11G, 11B, layers above light emitting layers 14c-R, 14c-B may be formed as common layers. In this case, a green light emitting layer 14c-G serving also as a photosensitizing layer 14d, an electron transport layer 14e, and a cathode 15 are formed as continuous patterns in common for all display area, and the other layers are used as patterned layers.

The green light emitting layer 14c-G serving as a common layer for all pixels is provided as a photosensitizing layer 14d in the red light emitting device 11R (11). On the other hand, the green light emitting layer 14c-G is layered also in the blue light emitting layer 11B. Even in such a configuration, blue light emission with good chromaticity can sufficiently be obtained, in the case where the film thickness of the green light emitting layer 14c-B is large or in the case where the center of blue light emission is localized at an interface of the hole transport layer 14b. Furthermore, in the organic electroluminescence devices 11R (11), 11G, 11B, the structure of the organic layer is configured as a cavity structure in which emitted lights of colors are taken out, whereby only blue emitted light is taken out from the blue light emitting device 11B.

In manufacturing the display apparatus 10 with such a configuration, each of the layers above the green light emitting layer 14c-G (photosensitizing layer 14d) can be simultaneously formed for the display area by use of an area mask having a large aperture diameter. Accordingly, simplification of manufacturing steps of the display apparatus 10 can be contrived.

Incidentally, also in the fourth embodiment, the hole injection layer 14a and the hole transport layer 14b below the light emitting layer can be used as common layers (continuous patterns) for all the display area, whereby further simplification of the manufacturing steps of the display apparatus 10 can be contrived.

In addition, in the first to fourth examples as above, embodiments in which the present invention is applied to the active matrix type display apparatus have been described. However, the display apparatus according to the present invention is also applicable to a passive matrix type display apparatus, and, in that case, the same effect as above can be obtained.

Figure 8:
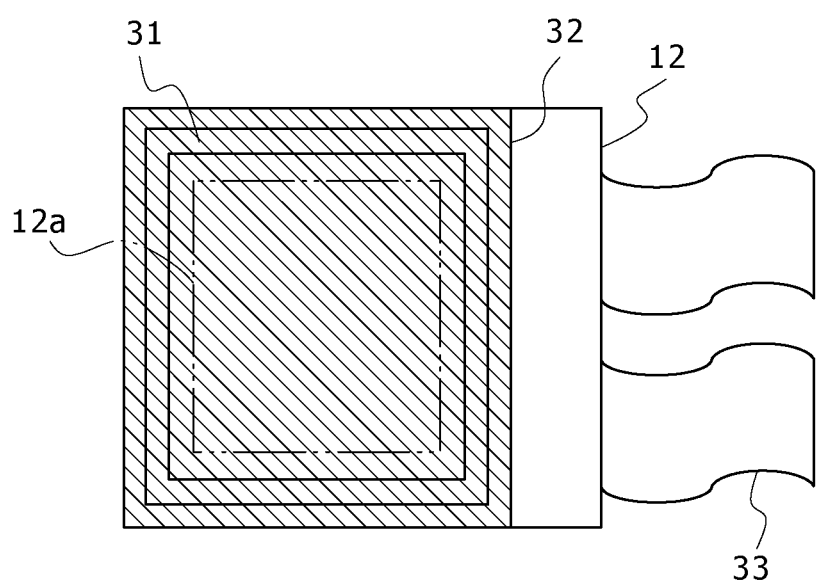
FIG. 8 is a block diagram showing a display apparatus having a module shape with a sealed configuration to which the present invention is applied.

The display apparatus according to the present invention as above-described includes a display apparatus in a module shape with a sealed configuration as disclosed in FIG. 8. For instance, a sealing part 31 is provided so as to surround a display area 12a serving as a pixel array area, and, with the sealing part 31 used as an adhesive, a display module is adhered to a counter part (sealing substrate 32) formed of a transparent glass or the like. The transparent sealing substrate 32 may be provided with a color filter, a protective film, a light blocking film or the like. Incidentally, the substrate 12 as the display module in which the display area 12a is formed may be provided with a flexible printed substrate 33 for input/output of signals to the display area 12a (pixel array area) and the like.

Application Example

In addition, the display apparatus according to the present invention as above-described is applicable to display units of electronic apparatuses in all fields on which picture signals inputted to the electronic apparatus or picture signals produced in the electronic apparatus are displayed as an image or picture, with the electronic apparatuses including various ones shown in FIGS. 9 to 13, for example, digital cameras, notebook size personal computers, portable remote terminals such as cell phones, video cameras, etc. Now, examples of electronic apparatus to which the present invention is applied will be described below.

Figure 9:
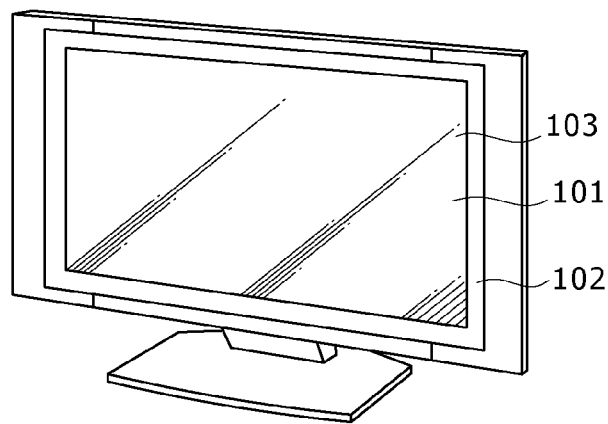
FIG. 9 is a perspective view of a television set to which the present invention is applied.

FIG. 9 is a perspective view of a television set to which the present invention is applied. The television set according to the present application example includes a picture display screen unit 101 composed of a front panel 102 and a filter glass 103 and so on, and is fabricated by using the display apparatus according to the present invention as the picture display screen unit 101.

Figure 10:
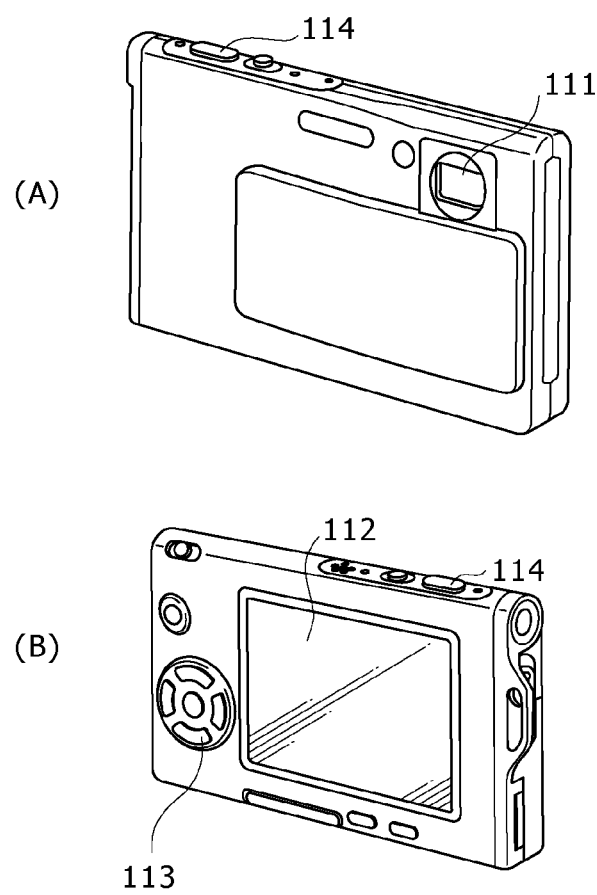
FIG. 10 shows views of a digital camera to which the present invention is applied, wherein (A) is a perspective view as viewed from the front side, and (B) is a perspective view as viewed from the back side.

FIG. 10 illustrates a digital camera to which the present invention is applied, wherein (A) is a perspective view as viewed from the front side, and (B) is a perspective view as viewed from the back side. The digital camera according to the present application example includes a light emitting unit 111 for flash, a display unit 112, a menu switch 113, a shutter button 114, etc., and is fabricated by using the display apparatus according to the present invention as the display unit 112.

Figure 11:
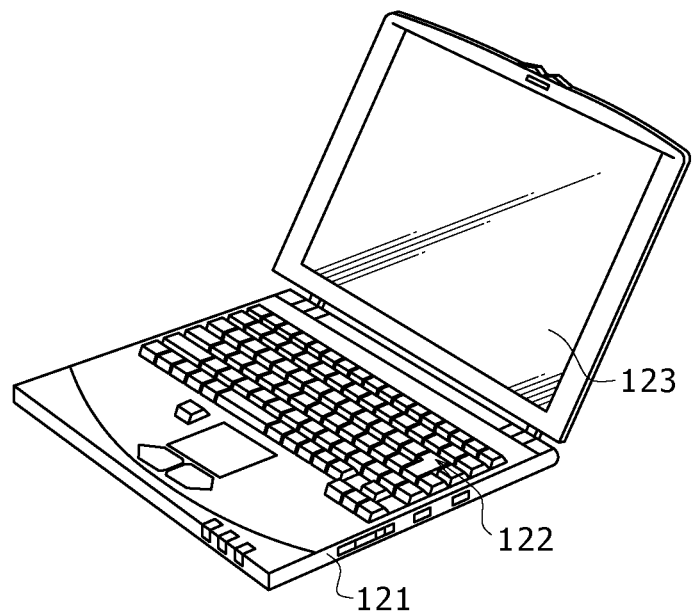
FIG. 11 is a perspective view of a notebook size personal computer to which the present invention is applied.

FIG. 11 is a perspective view of a notebook size personal computer to which the present invention is applied. The notebook size personal computer according to the present application example includes a main body 121, a keyboard 122 operated at the time of inputting characters and the like, a display unit 123 for displaying images, etc., and is fabricated by using the display apparatus according to the present invention as the display unit 123.

Figure 12:
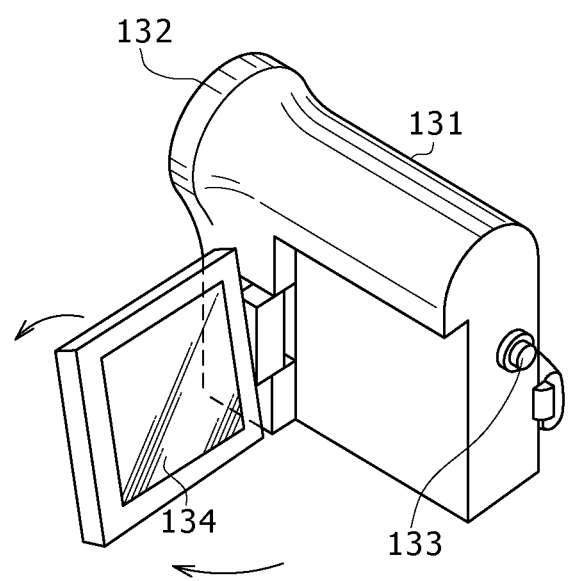
FIG. 12 is a perspective view of a video camera to which the present invention is applied.

FIG. 12 is a perspective view of a video camera to which the present invention is applied. The video camera according to the present application example includes a main body unit 131, a lens 132 for imaging a subject, which is provided at a side surface oriented forward, a start/stop switch 133 operated at the time of imaging, a display unit 134, etc., and is fabricated by using the display apparatus according to the present invention as the display unit 134.

Figure 13:
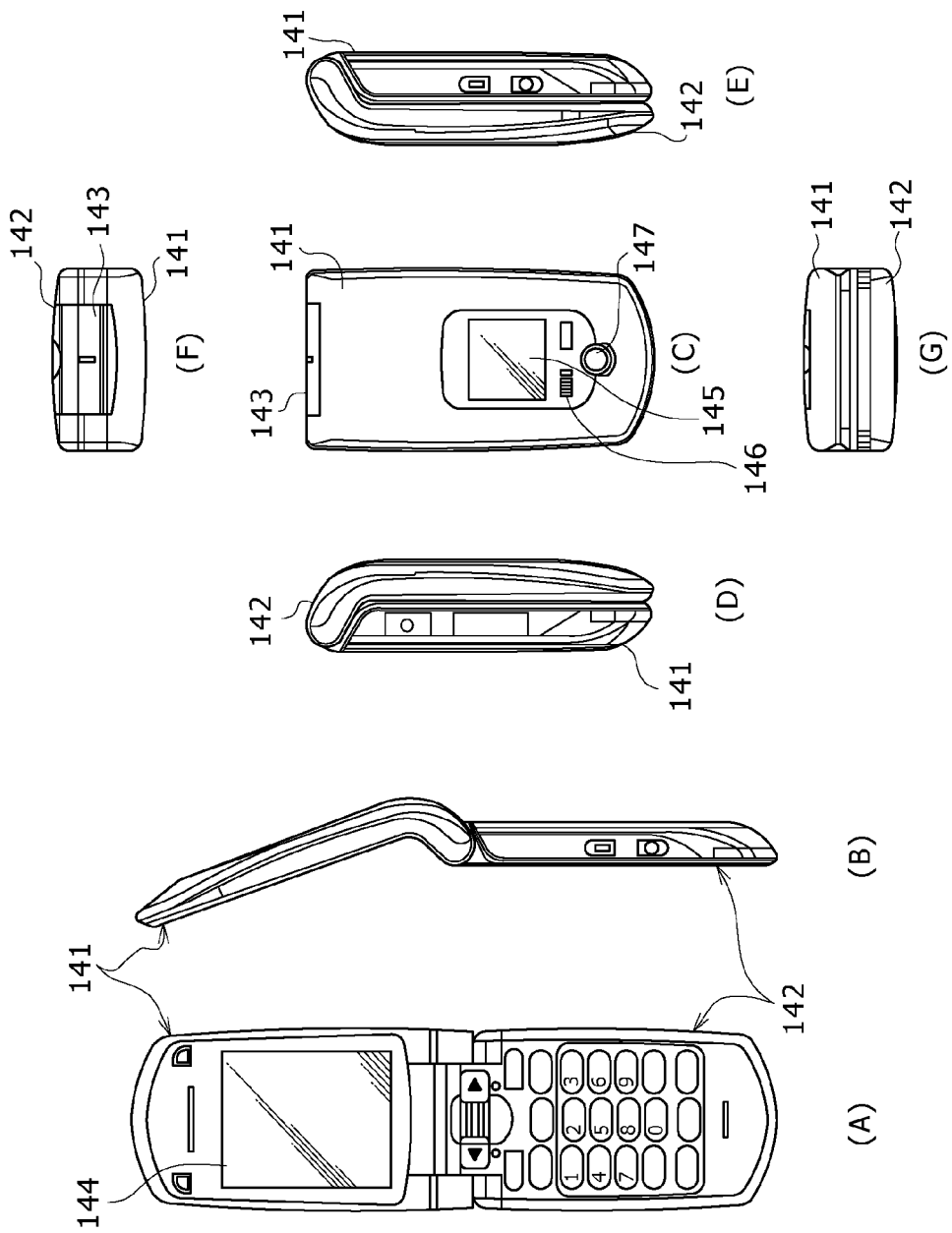
FIG. 13 illustrates a portable terminal device, for example, a cell phone to which the present invention is applied, wherein (A) is a front view of the cell phone in its opened state, (B) is a side view of the same, (C) is a front view of the cell phone in its closed state, (D) is a left side view, (E) is a right side view, (F) is a top plan view, and (G) is a bottom view.

FIG. 13 illustrates a portable terminal device, for example, a cell phone to which the present invention is applied, wherein (A) is a front view of the cell phone in an opened state, (B) is a side view of the same, (C) is a front view of the cell phone in a closed state, (D) is a left side view, (E) is a right side view, (F) is a top plan view, and (G) is a bottom view. The cell phone according to the present application example includes an upper-side casing 141, a lower-side casing 142, a connection part (here, a hinge part) 143, a display 144, a sub-display 145, a picture light 146, a camera 147, etc., and is fabricated by using the display apparatus according to the present invention as the display 144 and/or the sub-display 145.

EXAMPLES

Manufacturing procedures for organic electroluminescence devices according to specific examples and comparative examples of the present invention will be described referring to FIG. 1, and evaluation results of the organic electroluminescence devices will subsequently be described.

Examples 1 to 3

First, a cell for a top emission type organic electroluminescence device was fabricated in which an ITO transparent electrode of 12.5 nm in thickness as anode 13 was layered on an Ag alloy layer (reflective layer) of 190 nm in thickness on a substrate 12 composed of a 30 mm×30 mm glass sheet.

Next, as a hole injection layer 14a of an organic layer 14, a film of m-MTDATA represented by the following structural formula (101) was formed in a thickness of 12 nm (at a vapor deposition rate of 0.2-0.4 nm/sec) by a vacuum evaporation method. Here, m-MTDATA stands for 4,4',4"-tris(phenyl-m-tolylamino)triphenylamine.

[Chemical 14]

Structural Formula (101)

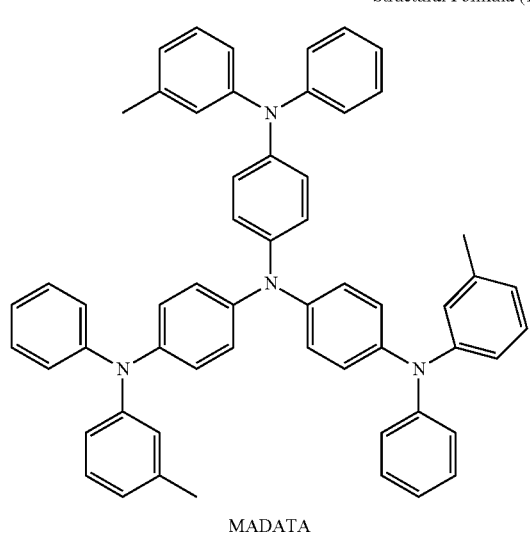

MADATA

Subsequently, as a hole transport layer 14b, a film of α-NPD represented by the following structural formula (102) was formed in a thickness of 12 nm (at a vapor deposition rate of 0.2 to 0.4 nm/sec). Here, α-NPD stands for N,N'-bis(1-naphthyl)-N,N'-diphenyl[1,1'-biphenyl]-4,4'-diamine.

[Chemical 15]

Structural Formula (102)

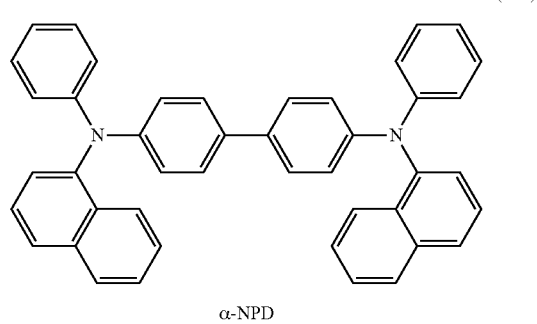

α-NPD

Next, a light emitting layer 14c of 30 nm in thickness was formed by vapor deposition on the hole transport layer 14b. In this case, rubrene was used as a host material, and was doped with dibenzo[f,f']diindeno[1,2,3-cd:1',2',3'-lm]perylene derivative represented by the following structural formula (103) as a red light emitting guest material in a relative film thickness ratio of 1%.

[Chemical 16]

Structural Formula (103)

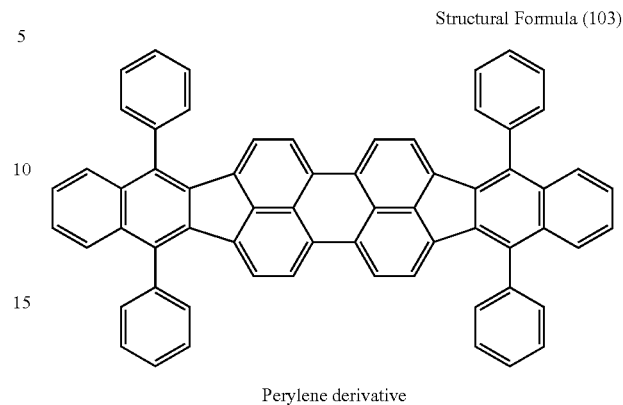

Perylene derivative

On the light emitting layer 14c thus formed, a photosensitizing layer 14d of 25 nm in thickness was formed by vapor deposition. In this case, 4,4'-bis(carbazol-9-yl)-biphenyl (CBP) represented by the following structural formula (104) was used as a host material, and was doped with Ir(ppy)$_3$ represented by the following structural formula (105) as a light emitting guest material (phosphorescent material). The light emitting guest material (phosphorescent material) was used in doping amounts (relative film thickness ratios) of 5%, 10%, and 15% in Examples 1 to 3, respectively.

[Chemical 17]

Structural Formula (104)

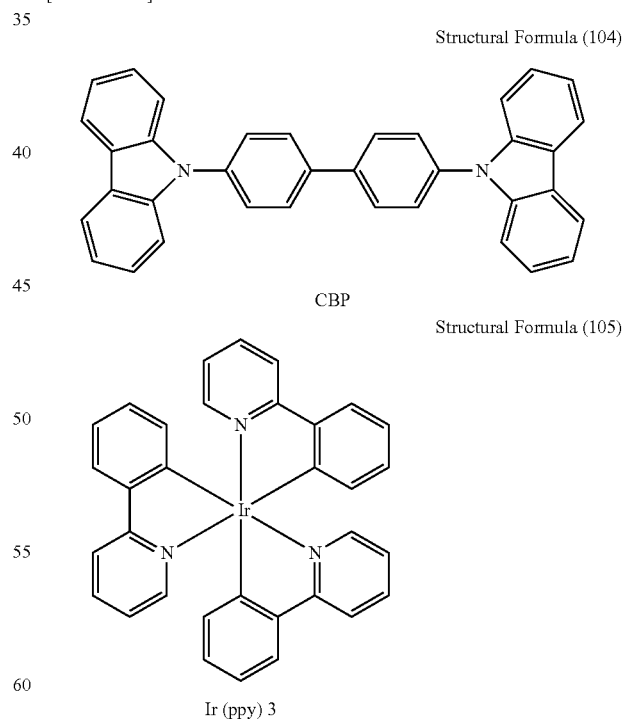

CBP

Structural Formula (105)

Ir (ppy) 3

Subsequently, as an electron transport layer 14a, Alq3 (8-hydroxyquinoline aluminum) represented by the following structural formula (106) was vapor deposited in a thickness of 10 nm.

[Chemical 18]

Structural Formula (106)

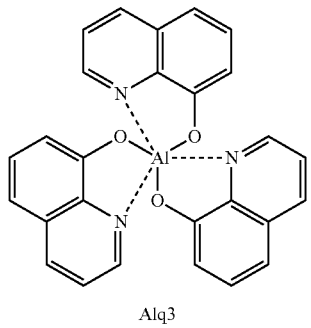

Alq3

After the organic layer 14 composed of the hole injection layer 14a, the hole transport layer 14b, the light emitting layer 14c, the photosensitizing layer 14d, and the electron transport layer 14e were sequentially layered in the above-mentioned manner, a film of LiF was formed in a thickness of about 0.3 nm (at a vapor deposition rate of 0.01 nm/sec.) as a first layer 15a of a cathode 15 by a vacuum evaporation method. Finally, a MgAg film of 10 nm in thickness was formed on the first layer 15a, as a second layer 15b of the cathode 15, by a vacuum evaporation method.

In this manner, organic electroluminescence devices of Examples 1 to 3 were fabricated.

Examples 4 and 5

In the formation of the photosensitizing layer 14d in the manufacturing procedure for the organic electroluminescence devices described in Examples 1 to 3, materials represented by the structural formulas (107) and (108) were respectively used as the light emitting guest material (phosphorescent material). The doping amount of the light emitting guest material (phosphorescent material) was 10% in both Examples 4 and 5. With the other factors set to be the same as in Examples 1 to 3, organic electroluminescence devices were fabricated.

[Chemical 19]

Structural Formula (107)

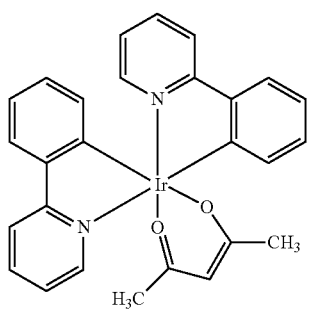

Structural Formula (108)

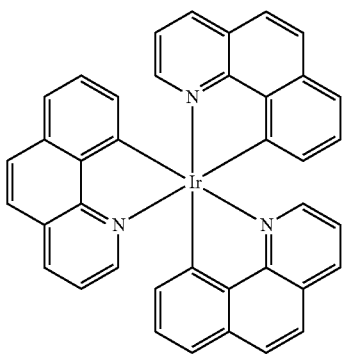

Examples 6 and 7

In the formation of the photosensitizing layer 14d in the manufacturing procedure for the organic electroluminescence devices described in Examples 1 to 3, a material represented by the structural formula (109) was used as the host material, whereas materials represented by the structural formula (110) and the structural formula (111) were used as the corresponding light emitting guest material (phosphorescent material). The doping amount of the light emitting guest material was 10% in both Examples 6 and 7. With the other factors set to be the same as in Examples 1 to 3, organic electroluminescence devices were fabricated.

[Chemical 20]

Structural Formula (109)

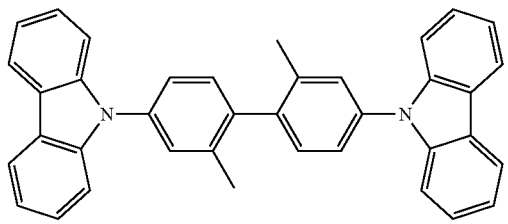

Structural Formula (111)

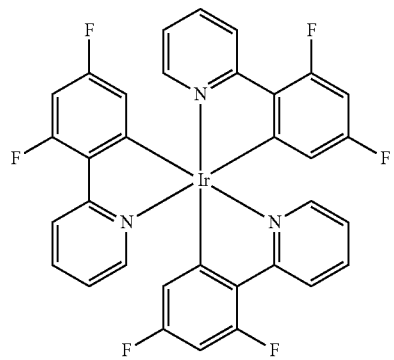

-continued

Structural Formula (110)

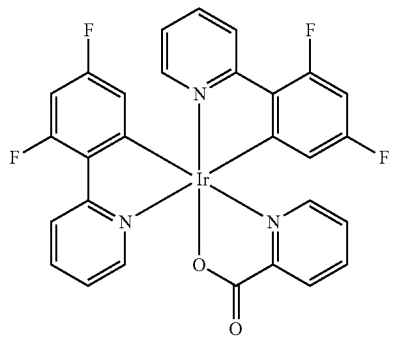

Comparative Example 1

The formation of the photosensitizing layer 14d in the manufacturing procedure for organic electroluminescence devices described in Examples 1 to 3 was omitted, and, instead, the electron transport layer composed of Alq3 (8-hydroxyquinoline aluminum) was increased in thickness to 45 nm. The other factors were set to be the same as in Examples 1 to 3.

Comparative Example 2

In the formation of the photosensitizing layer 14d in the manufacturing procedure for organic electroluminescence devices described in Example 1 to 3, the photosensitizing layer 14d was formed by using the host material alone, without using the light emitting guest material (phosphorescent material) as a dopant. The other factors were set to be the same as in Examples 1 to 3.

<Evaluation Results>

For the organic electroluminescence devices fabricated in Examples 1 to 7 and Comparative Examples 1 and 2 above, a driving voltage (V) at the time of driving at a current density of 10 mA/cm$^2$ as well as current efficiency (cd/A) and color coordinates (x, y) was measured. The results are set forth in Table 1 below.

devices of Comparative Examples 1 and 2 carried out without application of the present invention. This shows that the energy generated upon recombination in the photosensitizing layer 14d formed by doping the host material with the phosphorescent material serving as a light emitting guest material produces a photosensitizing (emission amount increasing) effect in the light emitting layer 14c.

Besides, in the organic electroluminescence devices of Examples 1 to 7, notwithstanding the photosensitizing layer 14d formed by doping the host material with a green or blue light emitting phosphorescent material as a light emitting guest material was layered on the red light emitting layer 14c, the color coordinate of the emitted light was kept at (0.64, 0.34), namely, red light emission was observed, without any color mixing influence due to green light emission. Especially, even in the organic electroluminescence device in any of Examples 4 to 7 wherein the kind of the light emitting guest material (phosphorescent material) with which to dope the photosensitizing layer 14d was changed, the color coordinate of the emitted light was (0.64, 0.34). Based on this, it was confirmed that according to the configuration of the present invention, red emitted light generated in the red light emitting layer 14c was taken out, notwithstanding the presence of the light emitting guest material (phosphorescent material) in the photosensitizing layer 14d.

From the evaluation results for Examples and Comparative Examples as above-mentioned, the following was confirmed. According to the configuration of the present invention wherein materials selected from among known organic materials were used as the host material and the dopant material for constituting the red light emitting layer 14c and wherein the photosensitizing layer 14d containing one of various green or blue light emitting guest materials (phosphorescent materials) was provided adjacently to the light emitting layer 14c, a drastic enhancement of luminous efficiency (current efficiency) can be contrived while maintaining the color purity of red.

In addition, the evaluation results show that it is possible, by configuring each pixel using the green light emitting device and the blue light emitting device in one set together with the organic electroluminescence device, to achieve full-color display with high color reproduction performance.

TABLE 1

| | Light emitting layer 14c | | Photosensitizing layer 14d | | | Driving voltage [V] | Current efficiency [cd/A] | Color coordinate (x, y) |
|---|---|---|---|---|---|---|---|---|
| | Host | Guest | Host | Guest | Guest ratio | | | |
| Example 1 | Rubrene | SF (103) | SF(104) | SF(105) | 5% | 7.9 | 14.6 | (0.64, 0.34) |
| Example 2 | | | | | 10% | 7./8 | 13.9 | (0.64, 0.34) |
| Example 3 | | | | | 15% | 7.6 | 13.6 | (0.64, 0.34) |
| Example 4 | | | | SF(107) | 10% | 7.7 | 13.2 | (0.64, 0.34) |
| Example 5 | | | | SF(108) | 10% | 7.6 | 11.5 | (0.64, 0.34) |
| Example 6 | | | SF(109) | SF(110) | 10% | 7.8 | 12.7 | (0.64, 0.34) |
| Example 7 | | | | SF(111) | 10% | 7.9 | 13.6 | (0.64, 0.34) |
| Comp. Ex. 1 | | | — | — | — | 7.4 | 6.5 | (0.64, 0.33) |
| Comp. Ex. 2 | | | SF(104) | — | — | 7.8 | ★ | (0.66, 0.38) |

SF: Structural Formula

As shown in Table 1 above, in each of the organic electroluminescence devices of Examples 1 to 7 to which the present invention was applied, a current efficiency as high as about 2 times for a comparable level of driving voltage was obtained, as compared with the organic electroluminescence

DESCRIPTION OF REFERENCE SYMBOLS

10 . . . Display apparatus, 11 . . . Organic electroluminescence device, 11R . . . Red light emitting device, 11B . . . Blue light emitting device (Blue light emitting organic electroluminescence device), 11G ... Green light emitting device (Green light emitting organic electroluminescence device), 12 ... Substrate, 13 ... Anode, 14 ... Organic layer, 14c ... Light emitting layer, 14d ... Photosensitizing layer, 15 ... Cathode

The invention claimed is:

1. An organic electroluminescence device comprising:
   an anode;
   a light emitting layer containing, together with a red color emitting guest material, a host material of which a parent skeleton includes a polycyclic aromatic hydrocarbon compound of 4 to 7 rings;
   a photosensitizing layer which contains a phosphorescent material including an organic material and which is stacked adjacently to the light emitting layer; and
   a cathode provided in such a state that the light emitting layer and the photosensitizing layer are sandwiched between the cathode and the anode.

2. The organic electroluminescence device according to claim 1,
   wherein the phosphorescent material phosphoresces at a wavelength shorter than the wavelength of the light emitted from the red light emitting guest material.

3. The organic electroluminescence device according to claim 1,
   wherein the phosphorescent material is selected from among a iridium complex, a platinum complex, a rhenium complex, an osmium complex, a ruthenium complex, and a gold complex.

4. The organic electroluminescence device according to claim 1,
   wherein the photosensitizing layer is provided between the light emitting layer and the cathode, adjacently to the light emitting layer.

5. The organic electroluminescence device according to claim 1,
   wherein the photosensitizing layer contains the phosphorescent material as the light emitting guest material, and an organic material including a derivative of an aromatic hydrocarbon having 6 to 60 carbon atoms or a connected body thereof as the host material.

6. The organic electroluminescence device according to claim 1,
   wherein the parent skeleton of the polycyclic aromatic hydrocarbon compound constituting the host material in the light emitting layer is selected from among pyrene, benzopyrene, chrysene, naphthacene, benzonaphthacene, dibenzonaphthacene, perylene, and coronene.

7. The organic electroluminescence device according to claim 1,
   wherein as the host material in the light emitting layer, use is made of a compound represented by the following general formula (1):

[Chemical 1]

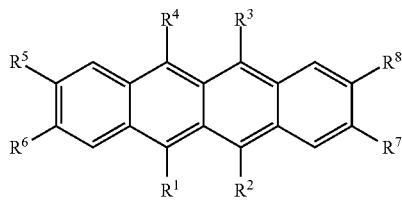

General Formula (1)

where $R^1$ to $R^8$ are each independently hydrogen, a halogen, a hydroxyl group, a substituted or unsubstituted carbonyl group of up to 20 carbon atoms, a substituted or unsubstituted carbonyl ester group of up to 20 carbon atoms, a substituted or unsubstituted alkyl group of up to 20 carbon atoms, a substituted or unsubstituted alkenyl group of up to 20 carbon atoms, a substituted or unsubstituted alkoxyl group of up to 20 carbon atoms, a cyano group, a nitro group, a substituted or unsubstituted silyl group of up to 30 carbon atoms, a substituted or unsubstituted aryl group of up to 30 carbon atoms, a substituted or unsubstituted heterocyclic group of up to 30 carbon atoms, or a substituted or unsubstituted amino group of up to 30 carbon atoms.

8. The organic electroluminescence device according to claim 1,
   wherein the red emitted light generated in the light emitting layer undergoes multiple beam interference at an interlayer position between the anode and the cathode, before being emitted from the side of one of the anode and the cathode.

9. A display apparatus comprising:
   an anode;
   a light emitting layer containing, together with a red light emitting guest material, a host material of which a parent skeleton includes a polycyclic aromatic hydrocarbon compound of 4 to 7 rings;
   a photosensitizing layer which contains a phosphorescent material including an organic material and which is stacked adjacently to the light emitting layer;
   a cathode provided in such a state that the light emitting layer and the photosensitizing layer are sandwiched between the cathode and the anode; and
   a substrate on which organic electroluminescence devices are arranged, the organic electroluminescence devices each having the light emitting layer and the photosensitizing layer both sandwiched between the cathode and the anode.

10. The display apparatus according to claim 9,
    wherein the organic electroluminescence devices are provided in some of a plurality of pixels as red light emitting devices.

11. The display apparatus according to claim 10,
    wherein the photosensitizing layer in the organic electroluminescence device provided as the red light emitting device is provided as a light emitting layer in those organic electroluminescence devices other than the red light emitting device which are provided on the substrate, in the shape of a continuous pattern ranging over a plurality of pixels.

12. The display apparatus according to claim 10,
    wherein blue light emitting organic electroluminescence devices and green light emitting organic electroluminescence devices are provided on the substrate, together with the red light emitting devices.

* * * * *